(12) United States Patent
Kim et al.

(10) Patent No.: US 10,886,227 B2
(45) Date of Patent: Jan. 5, 2021

(54) SEMICONDUCTOR DEVICES

(71) Applicant: SAMSUNG ELECTRONICS CO., LTD., Suwon-si (KR)

(72) Inventors: Hyo-Jin Kim, Bucheon-si (KR); Chang-Hwa Kim, Hwaseong-si (KR); Hwi-Chan Jun, Yongin-si (KR); Chui-Hong Park, Seongnam-si (KR); Jae-Seok Yang, Hwaseong-si (KR); Kwan-Young Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/217,220

(22) Filed: Dec. 12, 2018

(65) Prior Publication Data
US 2019/0122988 A1 Apr. 25, 2019

Related U.S. Application Data

(62) Division of application No. 15/497,283, filed on Apr. 26, 2017, now Pat. No. 10,177,093.

(30) Foreign Application Priority Data

Oct. 5, 2016 (KR) ........................ 10-2016-0128085

(51) Int. Cl.
*H01L 23/535* (2006.01)
*H01L 27/088* (2006.01)
(Continued)

(52) U.S. Cl.
CPC ...... *H01L 23/535* (2013.01); *H01L 21/76826* (2013.01); *H01L 21/76829* (2013.01); *H01L 21/76895* (2013.01); *H01L 21/76897* (2013.01); *H01L 21/823431* (2013.01); *H01L 21/823475* (2013.01); *H01L 21/845* (2013.01); *H01L 27/088* (2013.01); *H01L 27/0886* (2013.01); *H01L 27/1211* (2013.01); *H01L 29/0649* (2013.01); *H01L 29/0847* (2013.01);
(Continued)

(58) Field of Classification Search
CPC .......... H01L 29/4175; H01L 29/41725; H01L 29/40; H01L 29/41; H01L 23/535; H01L 23/528
See application file for complete search history.

(56) References Cited

U.S. PATENT DOCUMENTS 6,627,528 B1   9/2003   Ishimaru
7,034,365 B2   4/2006   Park et al.
(Continued)

*Primary Examiner* — Wael M Fahmy
*Assistant Examiner* — Sarah K Salerno
(74) *Attorney, Agent, or Firm* — Lee IP Law, P.C.

(57) ABSTRACT

A semiconductor device and a method of manufacturing a semiconductor device, the device including gate structures on a substrate; source/drain layers on portions of the substrate that are adjacent the gate structures, respectively; first contact plugs contacting upper surfaces of the source/drain layers, respectively; a second contact plug contacting one of the gate structures, a sidewall of the second contact plug being covered by an insulating spacer; and a third contact plug commonly contacting an upper surface of at least one of the gate structures and at least one of the first contact plugs, at least a portion of a sidewall of the third contact plug not being covered by an insulating spacer.

20 Claims, 41 Drawing Sheets

(51) Int. Cl.
*H01L 21/84* (2006.01)
*H01L 27/12* (2006.01)
*H01L 21/768* (2006.01)
*H01L 29/08* (2006.01)
*H01L 21/8234* (2006.01)
*H01L 29/06* (2006.01)
*H01L 29/417* (2006.01)
*H01L 29/66* (2006.01)
*H01L 29/78* (2006.01)

(52) U.S. Cl.
CPC .. *H01L 29/41791* (2013.01); *H01L 29/66545* (2013.01); *H01L 29/785* (2013.01); *H01L 21/76831* (2013.01); *H01L 21/76889* (2013.01); *H01L 21/823481* (2013.01)

(56) References Cited

U.S. PATENT DOCUMENTS

| | | |
|---|---|---|
| 8,129,235 B2 | 3/2012 | Chou et al. |
| 8,673,776 B2 | 3/2014 | Wang |
| 8,877,577 B2 | 11/2014 | Wang |
| 8,952,547 B2 | 2/2015 | Liaw |
| 8,993,433 B2 | 3/2015 | Chen et al. |
| 9,190,404 B2 | 11/2015 | Lee et al. |
| 9,472,669 B1 | 10/2016 | Chiang et al. |
| 9,812,400 B1 | 11/2017 | Basker et al. |
| 2013/0193489 A1* | 8/2013 | Baars ................ H01L 21/28518 257/213 |
| 2014/0367356 A1 | 12/2014 | Dubois et al. |
| 2017/0117223 A1* | 4/2017 | Azmat ................ H01L 23/5286 |

* cited by examiner

SEMICONDUCTOR DEVICES

CROSS-REFERENCE TO RELATED APPLICATIONS

This is a divisional application based on pending application Ser. No. 15/497,283, filed Apr. 26, 2017, the entire contents of which is hereby incorporated by reference.

Korean Patent Application No. 10-2016-0128085, filed on Oct. 5, 2016 in the Korean Intellectual Property Office and entitled: "Semiconductor Devices And Methods Of Manufacturing The Same," is incorporated by reference herein in its entirety.

BACKGROUND

1. Field

Embodiments relate to semiconductor devices and methods of manufacturing the same.

2. Description of the Related Art

A first contact plug contacting an upper surface of a gate structure may be formed only above an isolation layer, and may not be in contact with a second contact plug contacting an upper surface of a source/drain layer.

SUMMARY

The embodiments may be realized by providing a semiconductor device including gate structures on a substrate; source/drain layers on portions of the substrate that are adjacent the gate structures, respectively; first contact plugs contacting upper surfaces of the source/drain layers, respectively; a second contact plug contacting one of the gate structures, a sidewall of the second contact plug being covered by an insulating spacer; and a third contact plug commonly contacting an upper surface of at least one of the gate structures and at least one of the first contact plugs, at least a portion of a sidewall of the third contact plug not being covered by an insulating spacer.

The embodiments may be realized by providing a semiconductor device including gate structures on a substrate; source/drain layers on portions of the substrate adjacent to the gate structures, respectively; first contact plugs contacting upper surfaces of ones of the source/drain layers, respectively, upper surfaces of the first contact plugs having a first height; at least one second contact plug contacting one or ones of the source/drain layers, an upper surface of the at least one second contact plug having a second height greater than the first height; an insulating interlayer covering at least upper sidewalls of the first and second contact plugs, the insulating interlayer including silicon oxide, and at least a portion of an upper portion of the insulating interlayer having a silicon content greater than that of a lower portion of the insulating interlayer; a third contact plug contacting one of the gate structures, the third contact plug being between the first contact plugs; and a fourth contact plug commonly contacting an upper surface of one of the gate structures and the at least one second contact plug.

The embodiments may be realized by providing a semiconductor device including active fins on a substrate, each of the active fins extending in a first direction that is substantially parallel to an upper surface of the substrate, the active fins being disposed in a second direction that is substantially parallel to the upper surface of the substrate and substantially perpendicular to the first direction, and lower sidewalls of the active fins being covered by an isolation pattern; one or more dummy active fins covered by the isolation pattern, each of the dummy active fins extending in the first direction; gate structures on the active fins and the isolation pattern, each of the gate structures extending in the second direction, and the gate structures being disposed in the first direction; source/drain layers on the active fins and the isolation pattern adjacent the gate structures in the first direction; first contact plugs and second contact plugs, the first and second contact plugs contacting upper surfaces of the source/drain layers, respectively; a third contact plug contacting one of the gate structures, a sidewall of the third contact plug being covered by an insulating spacer; a fourth contact plug commonly contacting an upper surface of at least one of the gate structures and of at least one of the second contact plugs; and wirings on the first to fourth contact plugs, each of the wirings extending in the first direction, and the wirings being disposed in the second direction, wherein the third contact plug is electrically connected to one of the wirings vertically overlapping the source/drain layers.

The embodiments may be realized by providing a method of manufacturing a semiconductor device, the method including forming transistors on a substrate such that each of the transistors includes a gate structure and a source/drain layer adjacent thereto; forming a first insulating interlayer on the substrate to cover the transistors; forming first contact plugs and a second contact plug through the first insulating interlayer to contact the source/drain layers, respectively; forming a second insulating interlayer on the first insulating interlayer, and the first and second contact plugs; forming first and second openings through the first and second insulating interlayers such that the first opening exposes one of the gate structures and the second opening commonly exposes at least one of the gate structures and the second contact plug adjacent thereto; forming a first insulating spacer on a sidewall of the first opening; and forming third and fourth contact plugs in the first and second openings, respectively.

The embodiments may be realized by providing a method of manufacturing a semiconductor device, the method including forming transistors on a substrate such that each of the transistors includes a gate structure and a source/drain layer adjacent thereto; forming a first insulating interlayer on the substrate to cover the transistors; forming first and second contact plugs through the first insulating interlayer to contact the source/drain layers, respectively; removing upper portions of the first contact plugs; implanting ions into an upper portion of the first insulating interlayer; forming a second insulating interlayer on the first insulating interlayer and the first and second contact plugs; and forming third and fourth contact plugs through the first and second insulating interlayers such that the third contact plug contacts one of the gate structures and the fourth contact plug commonly contacts at least one of the gate structures and the second contact plug adjacent thereto.

The embodiments may be realized by providing a semiconductor device including a substrate; gate structures on the substrate; source/drain layers adjacent to the gate structures; first contact plugs contacting upper surfaces of some of the source/drain layers; second contact plugs contacting upper surfaces of other ones of the source/drain layers; a third contact plug contacting one of the gate structures, a sidewall of the third contact plug being covered by an insulating spacer such that the third contact plug is electrically insulated from the first contact plugs; a fourth contact plug commonly contacting an upper surface of at least one of the gate structures and at least one of the second contact plugs.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
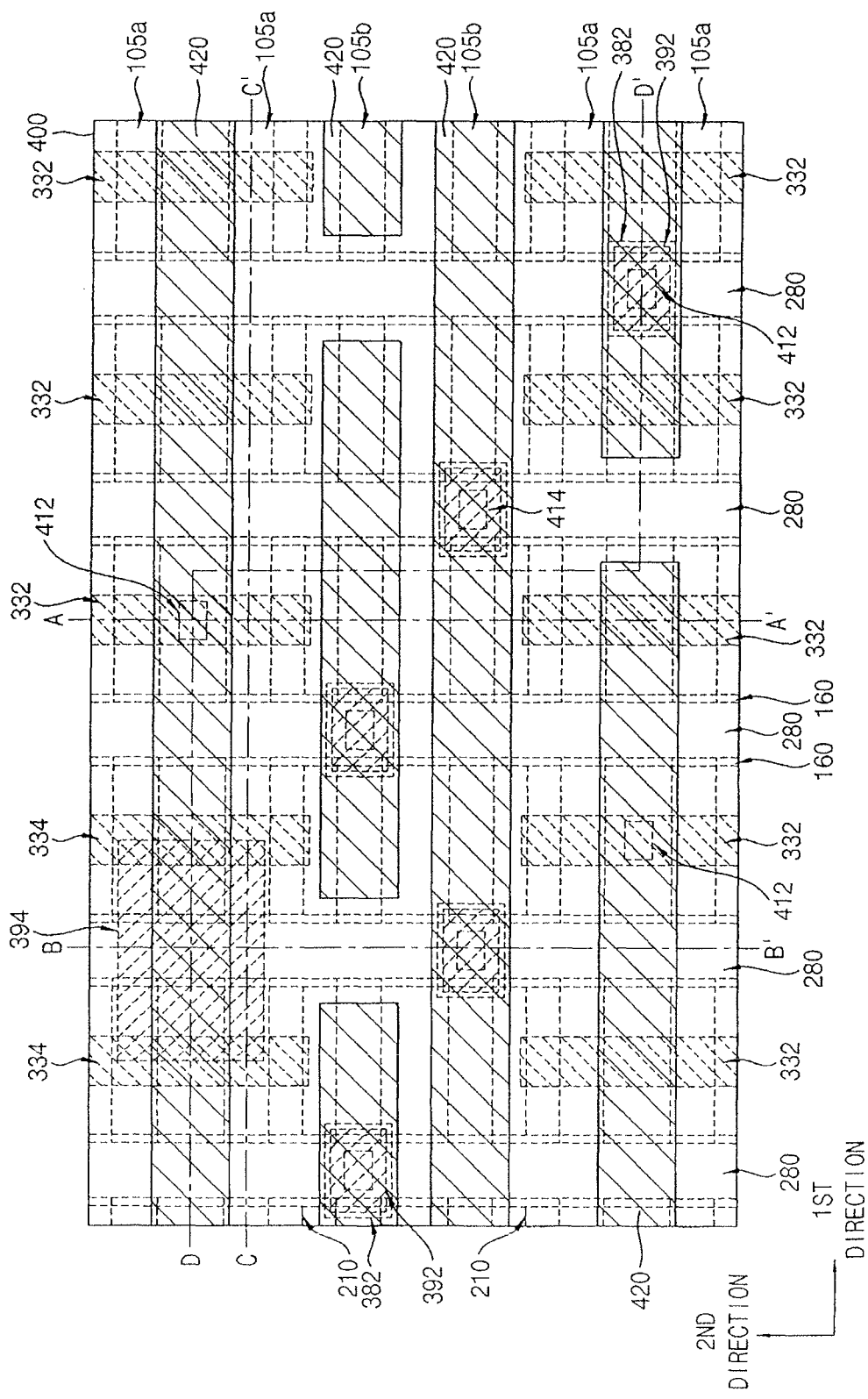
FIGS. 1 to 5 illustrate plan views and cross-sectional views of a semiconductor device in accordance with example embodiments.
Figure 2:
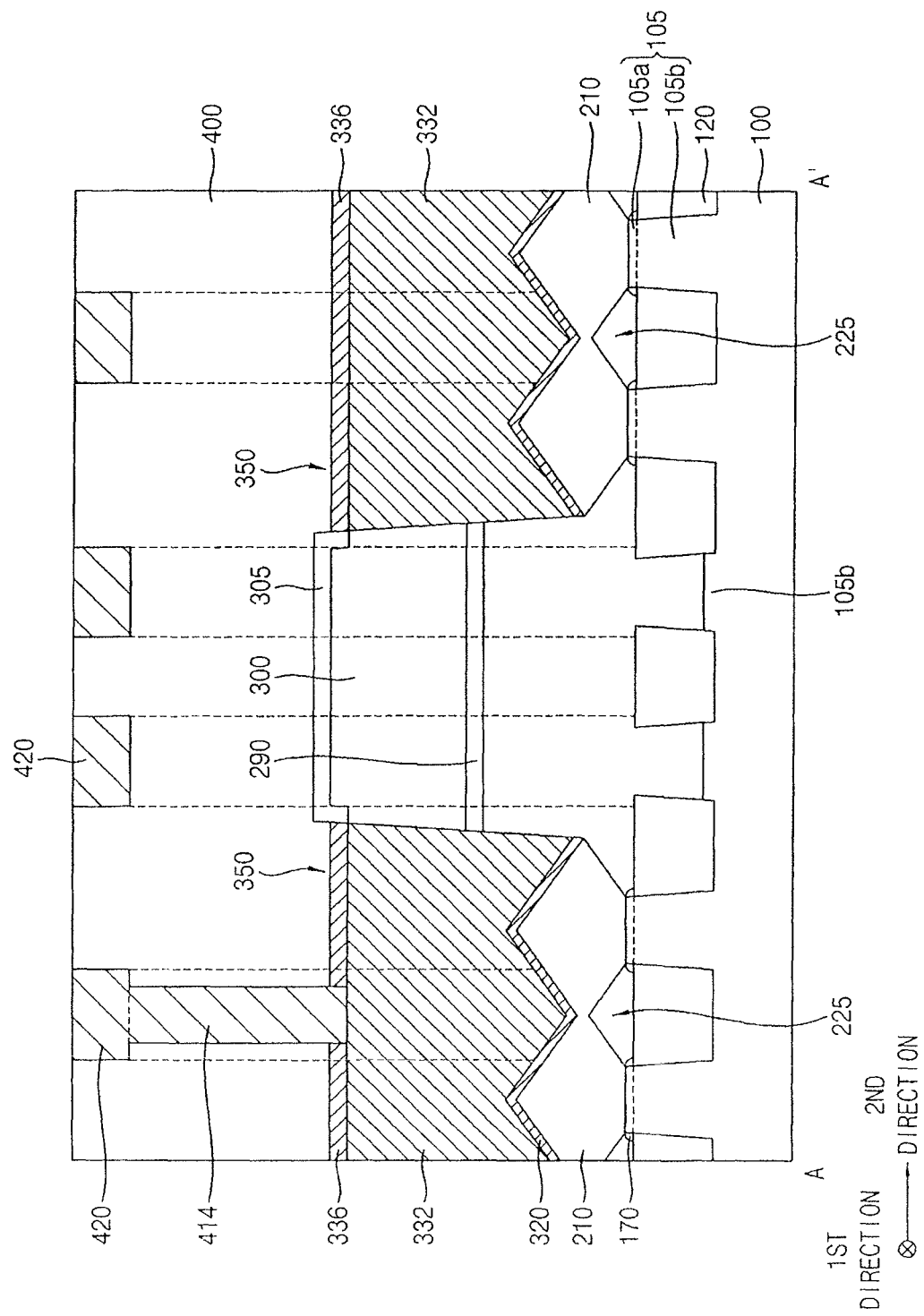
Figure 3:
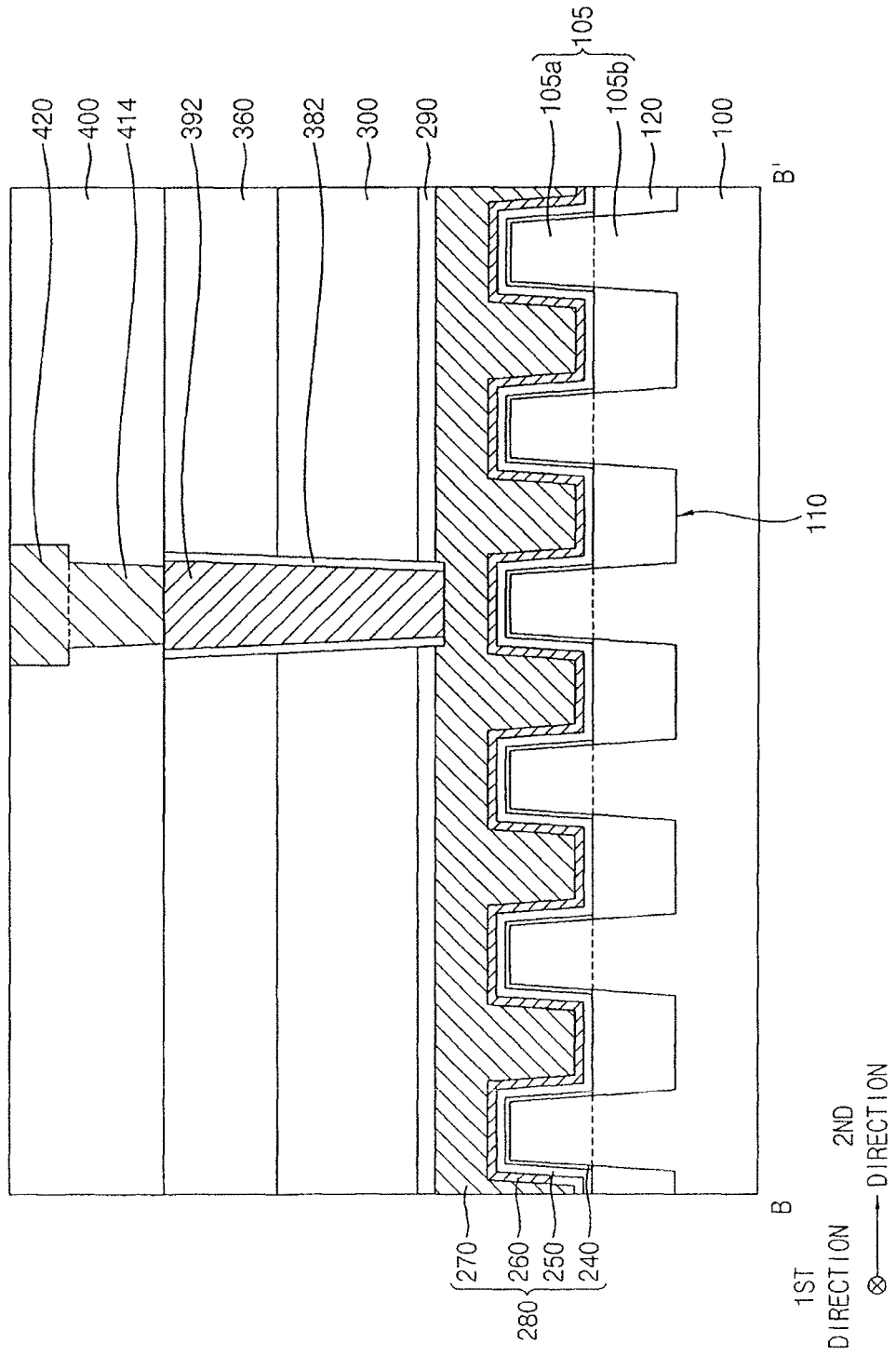
Figure 4:
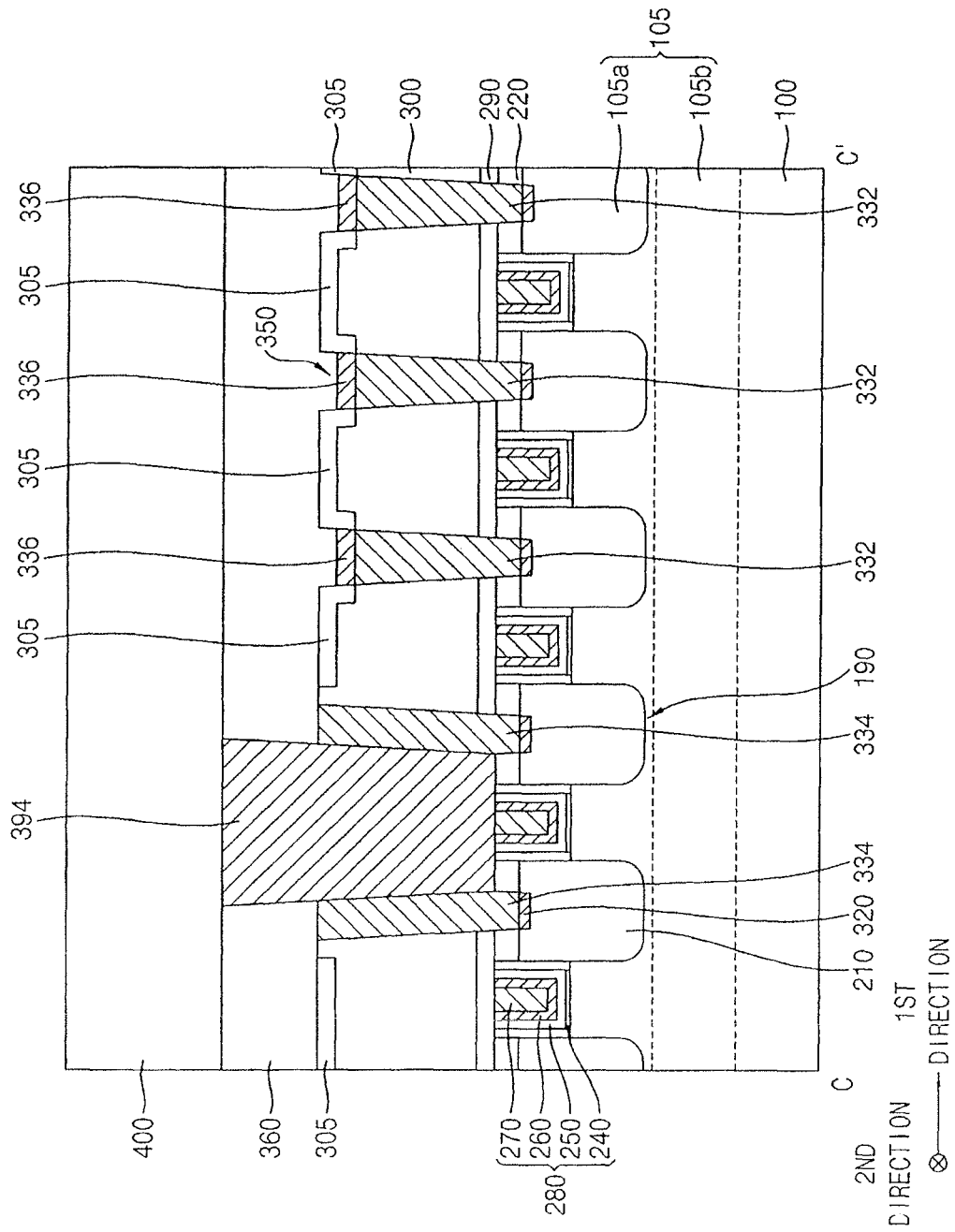
Figure 5:
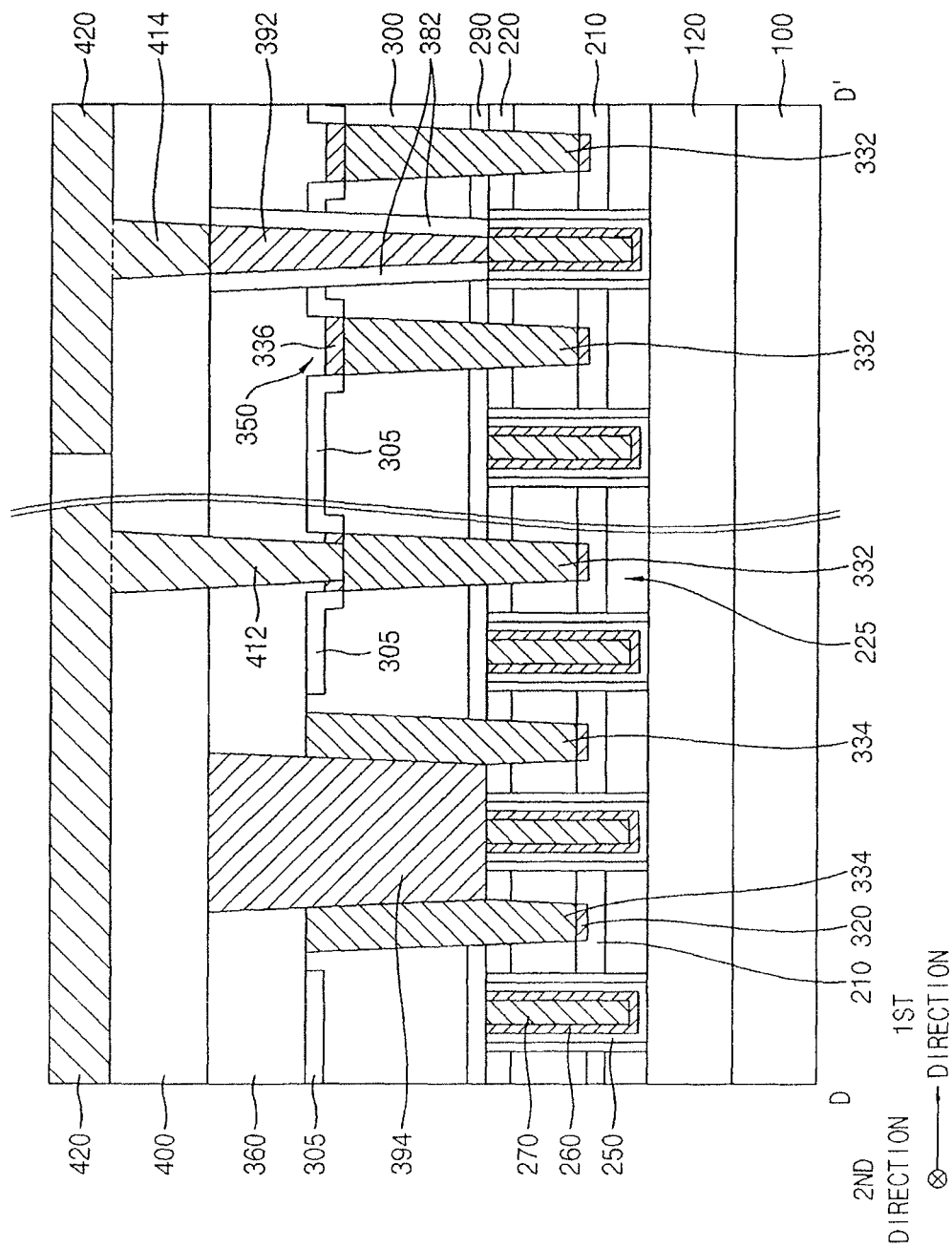

FIGS. 1 to 5 illustrate plan views and cross-sectional views of a semiconductor device in accordance with example embodiments. Particularly, FIG. 1 is a plan view, and FIGS. 2 to 5 are cross-sectional views. FIG. 2 is a cross-sectional view taken along a line A-A' of FIG. 1, FIG. 3 is a cross-sectional view taken along a line B-B' of FIG. 1, FIG. 4 is a cross-sectional view taken along a line C-C' of FIG. 1, and FIG. 5 is a cross-sectional view taken along a line D-D' of FIG. 1.

Referring to FIGS. 1 to 5, the semiconductor device may include gate structures 280 on a substrate 100, source/drain layers 210 on portions of the substrate 100 adjacent the gate structures 280, first contact plugs 332 contacting upper surfaces of ones of the source/drain layers 210 and including upper surfaces (e.g., facing away from the substrate 100) having a first height (e.g., as measured from the substrate 100), at least one second contact plug 334 contacting ones of the source/drain layers 210 and including an upper surface having a second height, a third contact plug 392 contacting an upper surface of one of the gate structures 280 and being between neighboring ones of the first contact plugs 332, and a fourth contact plug 394 commonly contacting an upper surface of one of the gate structures 280 and the second contact plug 334. For example, a distance from the substrate 100 to distal ends of the second contact plugs 334 may be greater that a distance from the substrate to distal ends of the first contact plugs 332.

The semiconductor device may further include first, second and third insulating interlayers 300, 360 and 400, an insulation reinforcing layer 305, a first insulating spacer 382, first and second vias 412 and 414, and wirings 420.

The substrate 100 may include a semiconductor material, e.g., silicon, germanium, silicon-germanium, etc., or III-V semiconductor compounds, e.g., GaP, GaAs, GaSb, etc. In an implementation, the substrate 100 may be a silicon-on-insulator (SOI) substrate, or a germanium-on-insulator (GOI) substrate.

A recess 110 and an isolation pattern 120 partially filling the first recess 110 may be formed on the substrate 100, and the substrate 100 may be divided into an active region 105 protruding from an upper surface of the substrate 100 and a field region. The active region 105 may be also referred to as an active fin.

In an implementation, the active fin 105 may extend in a first direction substantially parallel to an upper surface of the substrate 100, and a plurality of active fins 105 may be formed in a second direction substantially parallel to the upper surface of the substrate 100 and crossing the first direction. In an implementation, the first and second directions may cross each other at a right angle.

The active fin 105 may include a lower active pattern 105b of which a sidewall is covered by the isolation pattern 120, and an upper active fin 105a protruding from an upper surface of the isolation pattern 120.

In an implementation, the upper active patterns 105a of ones of the active fins 105 may be removed, and dummy active fins may be formed. Each of the dummy active fins may include a portion of the lower active pattern 105b, and a sidewall of the dummy active fin may be covered by the isolation pattern 120 and an upper surface of the dummy active fin may be covered by the insulation pattern 220. No source/drain layer 210 may be formed on an upper surface of the dummy active fin, unlike the active fin 105. In an implementation, one or a plurality of dummy active fins may be formed between the active fins 105, and may extend in the first direction.

The isolation pattern 120 may include an oxide, e.g., silicon oxide.

In an implementation, the gate structure 280 may extend in the second direction on the active fin 105 and the isolation pattern 120, and a plurality of gate structures 280 may be formed in the first direction. The gate structure 280 may include an interface pattern 240, a gate insulation pattern 250, a work function control pattern 260, and a gate electrode 270 sequentially stacked, and may form a transistor together with the source/drain layer 210. The transistor may be a positive-channel metal oxide semiconductor (PMOS) transistor or a negative-channel metal oxide semiconductor (NMOS) transistor according to the conductivity type of the source/drain layer 210.

The interface pattern 240 may include an oxide, e.g., silicon oxide, the gate insulation pattern 250 may include a metal oxide having a high dielectric constant, e.g., hafnium oxide, tantalum oxide, zirconium oxide, etc., the work function control pattern 260 may include a metal nitride or an alloy thereof, e.g., titanium nitride, titanium aluminum, titanium aluminum nitride, tantalum nitride, tantalum aluminum nitride, etc., and the gate electrode 270 may include a low resistance metal or a nitride thereof, e.g., aluminum, copper, tantalum, etc.

A gate spacer 160 may be formed on each of opposite sidewalls of the gate structure 280 in the first direction, and a fin spacer 170 may be formed on each of opposite sidewalls of the active fin 105 in the second direction. The gate spacer 160 and the fin spacer 170 may include a nitride, e.g., silicon nitride.

The source/drain layer 210 may fill a second recess 190 on the active fin 105 adjacent the gate structure 280 in the first direction, and may contact a sidewall of the gate spacer 160. In an implementation, the source/drain layer 210 may have a cross-section taken along the second direction having a pentagon-like shape.

In an implementation, the source/drain layer 210 may include single crystalline silicon-germanium doped with p-type impurities. In an implementation, the source/drain layer 210 may include single crystalline silicon carbide doped with n-type impurities or single crystalline silicon doped with n-type impurities.

In an implementation, when a distance between neighboring ones of the active fins 105 in the second direction is small, the source/drain layers 210 on upper surfaces of the respective ones of the active fins 105 may be connected to each other so as to be merged with each other. In an implementation, as illustrated the figures, two source/drain layers 210 on two neighboring active fins 105 in the second direction may be merged with each other. In an implementation, more than two source/drain layers 210 may be merged with each other.

An air gap 225 may be formed between the isolation pattern 120 and the merged source/drain layers 210.

The insulation layer 220 may be formed on the active fin 105, the dummy active fin, and the isolation pattern 120, and may cover a sidewall of the gate structure 280 and the source/drain layer 210. The insulation layer 220 may include, e.g., silicon oxide or Tonen Silazene (TOSZ).

A capping layer 290 and the first insulating interlayer 300 may be sequentially formed on the gate structure 280 and the insulation layer 220. The capping layer 290 may include a nitride, e.g., silicon nitride, and the first insulating interlayer 300 may include a silicon oxide, e.g., tetraethyl orthosilicate (TEOS).

The first and second contact plugs 332 and 334 may extend through the first insulating interlayer 300, the capping layer 290, and the insulation layer 220, and may contact upper surfaces of the source/drain layers 210. A first metal silicide pattern 320 may be formed between the source/drain layer 210 and each of the first and second contact plugs 332 and 334. The first metal silicide pattern 320 may include, e.g., titanium silicide, cobalt silicide, or nickel silicide, etc.

In an implementation, each of the first and second contact plugs 332 and 334 may have a high aspect ratio, and a width of each of the first and second contact plugs 332 and 334 may decrease from a top toward a bottom thereof. In an implementation, upper portions of the first contact plugs 332 may be removed after the first and second contact plugs 332 and 334 are formed (refer to FIGS. 25 to 28), and the upper portions having a relatively large width may be removed so that a distance between the first contact plugs 332 may be decreased. Accordingly, when an upper surface of the second contact plug 334 has a second height, an upper surface of each of the first contact plugs 332 may have a first height less than the second height.

As the upper portions of the first contact plugs 332 are removed, fourth recesses 350 may be formed on the first insulating interlayer 300, and thus an upper surface of the first insulating interlayer 300 may not have a uniform height. As a result, the first contact plugs 332 may be formed under the fourth recesses 350, respectively.

Each of the first and second contact plugs 332 and 334 may have a second metal pattern including a metal, e.g., tungsten, copper, etc., and a first barrier pattern covering a sidewall and a lower surface of the second metal pattern and including a metal nitride, e.g., tantalum nitride, titanium nitride, tungsten nitride, etc.

In an implementation, each of the first and second contact plugs 332 and 334 may be formed on the source/drain layers 210 on the upper surfaces of the active fins 105, and thus may not vertically overlap the dummy active fin including only the lower active pattern 105b.

Each of the first contact plugs 332 may extend in the second direction to a given length, and a plurality of first contact plugs 332 may be formed in the first direction. The second contact plug 334 may extend in the second direction to a given length, and one or more than one second contact plugs 334 may be formed in the first direction. In the figure, two second contact plugs 334 are formed in the first direction.

The insulation reinforcing layer 305 may be formed on the first insulating interlayer 300. The insulation reinforcing layer 305 may be formed by an ion implantation process onto the first insulating interlayer 300. When the first insulating interlayer 300 includes silicon oxide, silicon ions may be implanted into the first insulating interlayer 300 to form a silicon-rich silicon oxide layer. In an implementation, other types of ions may be implanted into the first insulating interlayer 300 to form the insulation reinforcing layer 305.

In an implementation, the insulation reinforcing layer 305 may be formed on the upper surface of the first insulating interlayer 300 with a uniform thickness. As the upper surface of the first insulating interlayer 300 does not have a uniform height, the insulation reinforcing layer 305 may not have a uniform height, either.

By the ion implantation process, ions may be also implanted into upper portions of the first contact plugs 332, and thus a second metal silicide pattern 336 may be formed on each of the first contact plugs 332.

The second insulating interlayer 360 may be formed on the first insulating interlayer 300 on which the insulation reinforcing layer 305 is formed, the first contact plugs 332 on which the second metal silicide patterns 336 are formed, and the second contact plug 334, and may include a nitride, e.g., silicon nitride.

The third contact plug 392 may extend through the second insulating interlayer 360, the insulation reinforcing layer 305, the first insulating interlayer 300, and the capping layer 290, and may contact an upper surface of one of the gate structures 280, and the fourth contact plug 394 may extend through the second insulating interlayer 360, the first insulating interlayer 300, a portion of the second contact plug 334, and the capping layer 290, and may contact an upper surface of one of the gate structures 280.

In an implementation, the third contact plug 392 may be formed between neighboring ones of the first contact plugs 332 in the first direction, which may be formed on the source/drain layers 210 at opposite sides of the gate structure 280, respectively, and thus may not vertically overlap the dummy active fin.

In an implementation, the fourth contact plug 394 may contact a sidewall of the second contact plug 334, and when two second contact plugs 394 are formed at opposite sides of the gate structure 280 in the first direction, the fourth contact plug 394 may contact respective opposite sidewalls of the two second contact plugs 394.

Each of the third and fourth contact plugs 392 and 394 may have a third metal pattern including a metal, e.g., tungsten, copper, etc., and a second barrier pattern covering a sidewall and a lower surface of the third metal pattern and including a metal nitride, e.g., tantalum nitride, titanium nitride, tungsten nitride, etc. In an implementation, each of the third and fourth contact plugs 392 and 394 may include only the third metal pattern.

A sidewall of the third contact plug 392 may be covered by the first insulating spacer 382. The first insulating spacer 382 may have a hollow cylindrical shape, and may include an oxide, e.g., silicon oxide.

In an implementation, the third contact plug 392 may be formed between neighboring ones of the first contact plugs 332 in the first direction. If a misalignment were to occur during the formation of a fourth opening 370 (refer to FIGS. 29 and 30) for forming the third contact plug 392, the sidewall of the third contact plug 392 may be covered by the first insulating spacer 382, and thus may be electrically insulated from the first contact plugs 332.

As the upper portions of the first contact plugs 332 having the relatively large width are removed, a distance between the third contact plug 392 and the first contact plugs 332 may increase, and thus the possibility that the first and third contact plugs 332 and 392 come into contact with each other may decrease.

Further, the insulation reinforcing layer 305 may be formed on the first insulating interlayer 300 through which the first contact plugs 332 are formed, and thus the electrical insulation between the first and third contact plugs 332 and 392 may be enhanced.

Accordingly, when compared to a case in which the third contact plug 392 vertically overlaps the dummy active fin, even when the third contact plug 392 is formed close to the first contact plugs 332 due to the reduction in the size of the semiconductor device, electrical insulation between the first and third contact plugs 332 and 392 may be enhanced and the possibility of an electrical short may decreased.

No insulating spacer may be formed on a sidewall of the fourth contact plug 394 commonly contacting the upper surface of the gate structure 280 and the second contact plug 334 adjacent thereto, unlike the third contact plug 392, and thus the contact resistance between the second and fourth contact plugs 334 and 394 may not increase.

The third insulating interlayer 400 may be formed on the second insulating interlayer 360, the third and fourth contact plugs 392 and 394, and the first insulating spacer 382, and the wirings 420 electrically connected to ones of the first to fourth contact plugs 332, 334, 392 and 394 may be formed in the third insulating interlayer 400.

In an implementation, each of the wirings 420 may extend in the first direction, and a plurality of wirings 420 may be formed in the second direction.

In an implementation, ones of the wirings 420 may be electrically connected to the first contact plug 332, which may be possible through the first via 412 extending through the second and third insulating interlayers 360 and 400 and contacting lower surfaces of the ones of the wirings 420 and an upper surface of the first contact plug 332. Other ones of the wirings 420 may be electrically connected to the third contact plug 392, which may be possible through the second via 414 extending through the third insulating interlayer 400 and contacting lower surfaces of the other ones of the wirings 420 and an upper surface of the third contact plug 392.

In an implementation, the underlying contact plugs 332, 334, 392 and 394 and the overlying wirings 420 may be connected to each other by various structures and/or methods.

In an implementation, each of the wirings 420 and the first and second vias 412 and 414 may have a fourth metal pattern and a third barrier pattern covering a sidewall and a lower surface of the fourth metal pattern.

In an implementation, ones of the wirings 420 may vertically overlap the dummy active fins, and ones of the wirings 420 may vertically overlap the active fins 105 or the source/drain layers 210 thereon.

The third contact plug 392 contacting the upper surface of the gate structure 280 between the first contact plugs 332 on the source/drain layers 210 may not vertically overlap the dummy active fins, and thus may be electrically connected to ones of the wirings 420 not vertically overlapping the dummy active fins.

As explained above, even if the third contact plug 392 is close to the first contact plugs 332 according to the cell layout, the possibility of electrical short between the first and third contact plugs 332 and 392 may decrease due to the first insulating spacer 382, the fourth recess 350, and the insulation reinforcing layer 305.

FIGS. 6 to 34 illustrate plan views and cross-sectional views of stages in a method of manufacturing a semiconductor device in accordance with example embodiments. Particularly, FIGS. 6, 8, 11, 15, 18, 22, 25, and 32 are plan views, and FIGS. 7, 9-10, 12-14, 15-17, 19-21, 23-24, 26-31, and 33-34 are cross-sectional views.

Figure 9:
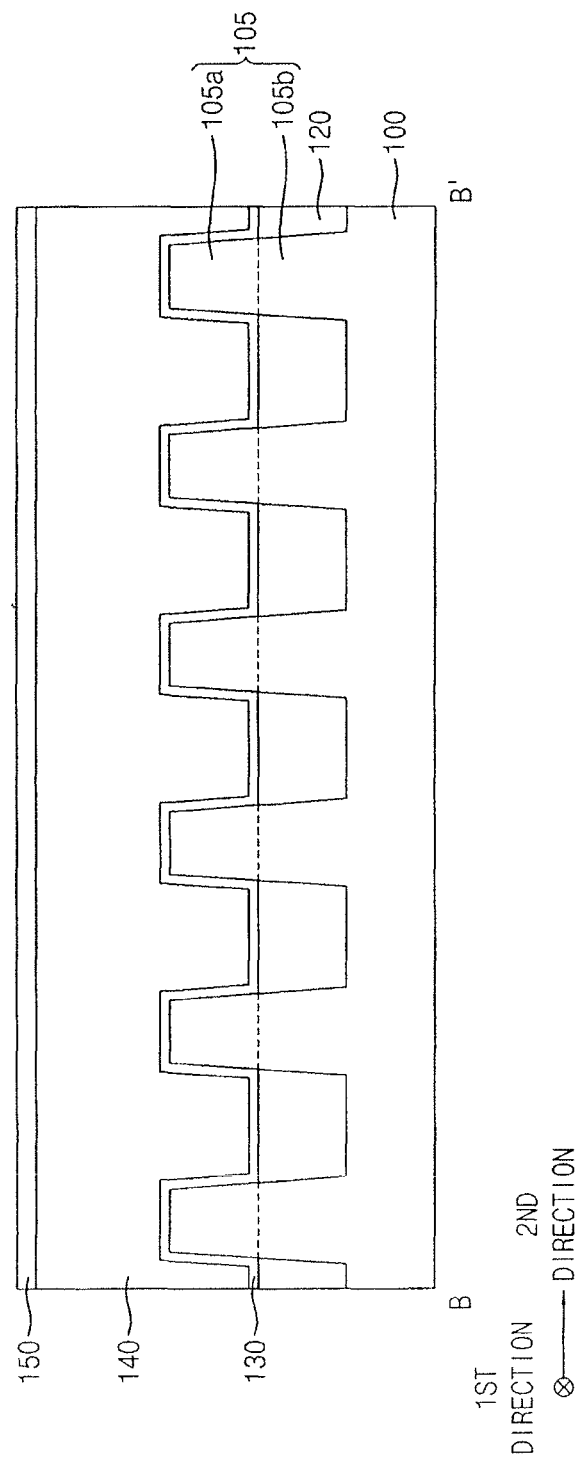
Figure 20:
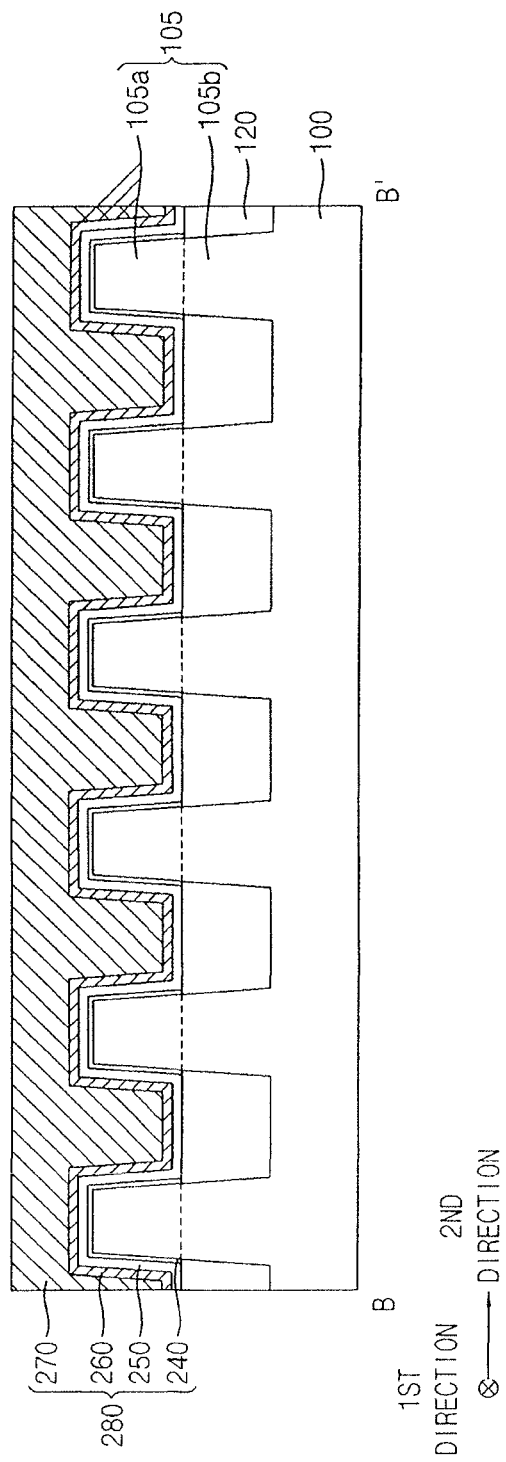
Figure 21:
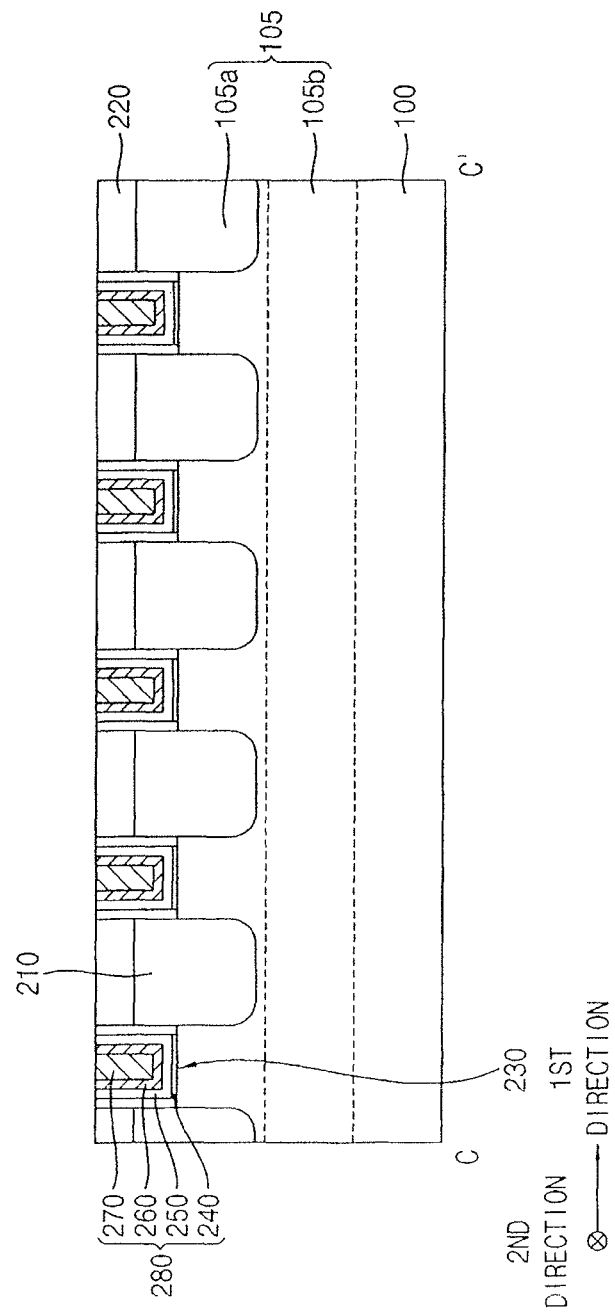

FIGS. 7, 12, 14, 16, 19, 23 and 26 are cross-sectional views taken along lines A-A' of corresponding plan views, respectively, FIGS. 9 and 20 are cross-sectional views taken along lines B-B' of corresponding plan views, respectively, FIGS. 10, 13, 17, 21, 24, 27, 29 and 33 are cross-sectional views taken along lines C-C' of corresponding plan views, respectively, and FIGS. 28, 30, 31 and 34 are cross-sectional views taken along lines D-D' of corresponding plan views, respectively.

Figure 6:
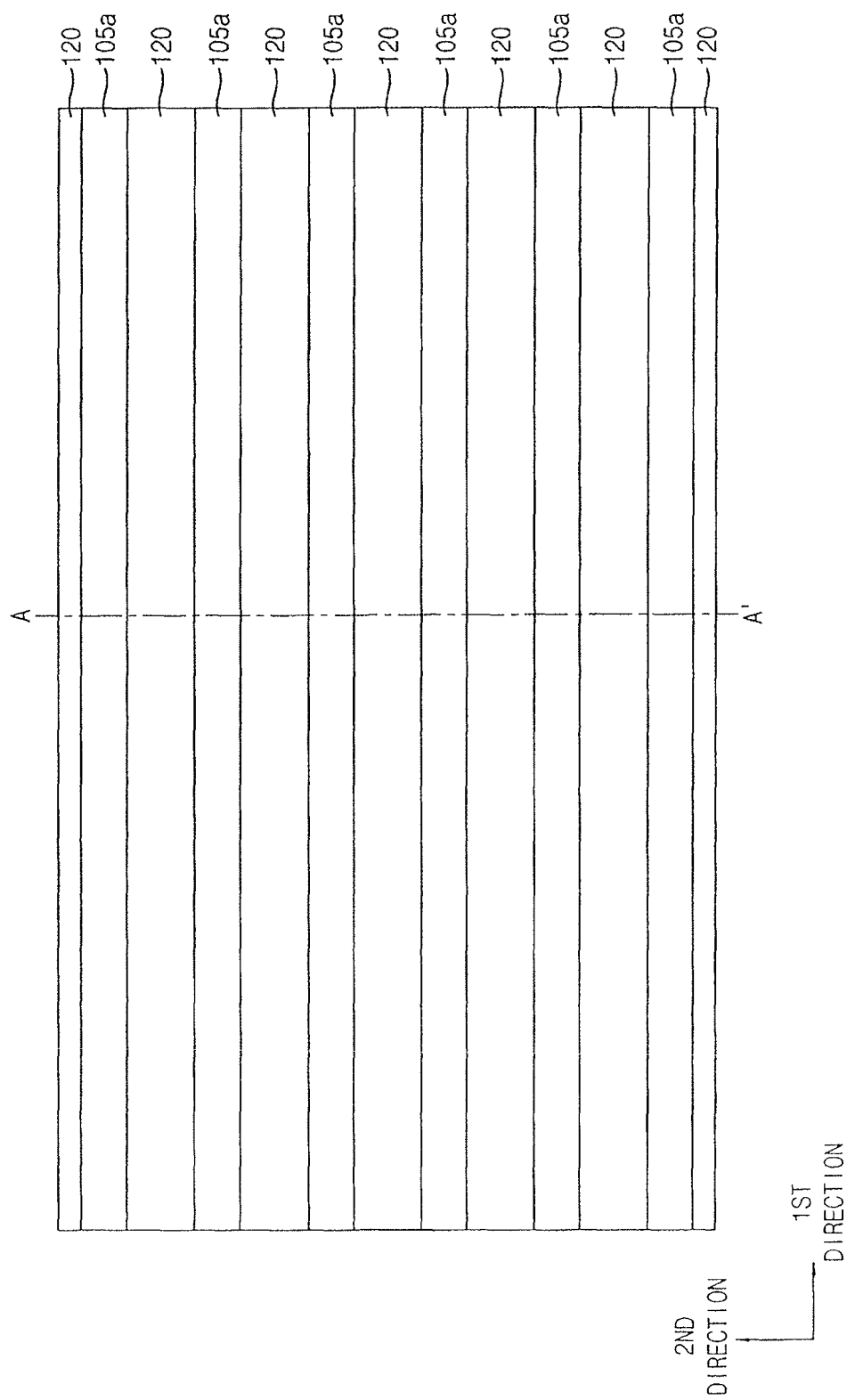
FIGS. 6 to 34 illustrate plan views and cross-sectional views of stages in a method of manufacturing a semiconductor device in accordance with example embodiments.
Figure 7:
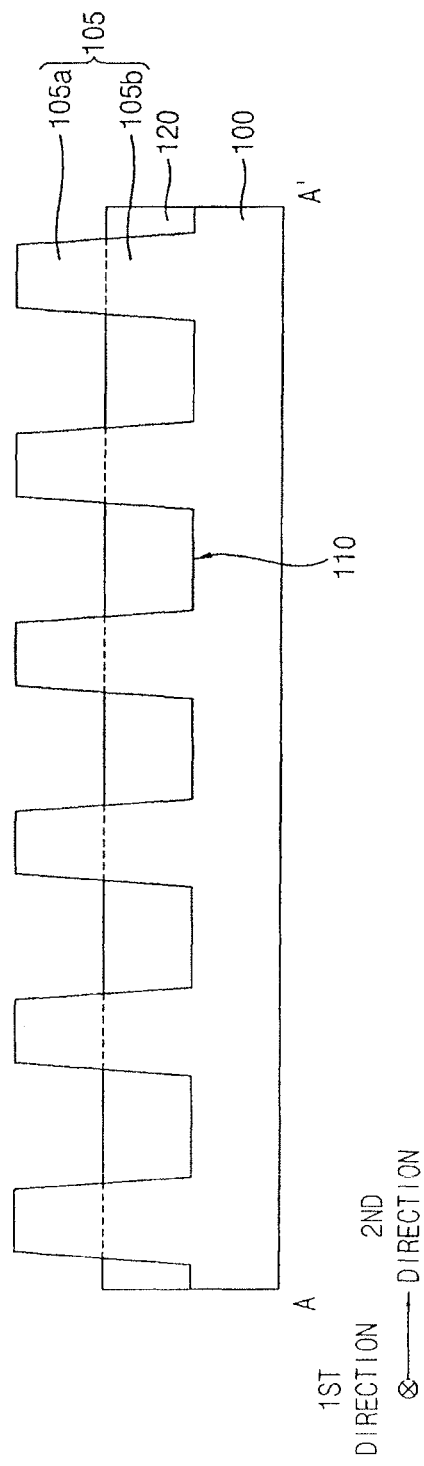

Referring to FIGS. 6 and 7, an upper portion of a substrate 100 may be partially etched to form a first recess 110, and an isolation pattern 120 may be formed to fill a lower portion of the first recess 110.

As the first recess 110 is formed on the substrate 100, an active region 105 may be defined on the substrate 100. The active region 105 may protrude from an upper surface of the substrate 100, and thus may be also referred to as an active fin. A region of the substrate 100 on which the active fin 105 is not formed may be referred to as a field region.

In an implementation, the active fin 105 may extend in a first direction substantially parallel to the upper surface of the substrate 100, and a plurality of active fins 105 may be formed in a second direction, which may be substantially parallel to the upper surface of the substrate 100 and cross the first direction. In an implementation, the first and second directions may cross each other at a right angle, and thus may be substantially perpendicular to each other.

In an implementation, the isolation pattern 120 may be formed by forming an isolation layer on the substrate 100 to sufficiently fill the first recess 110, planarizing the isolation layer until the upper surface of the substrate 100 is exposed, and removing an upper portion of the isolation layer to expose an upper portion of the first recess 110. The isolation layer may be formed of an oxide, e.g., silicon oxide.

As the isolation pattern 120 is formed on the substrate 100, the active fin 105 may be divided into a lower active pattern 105b (whose sidewall may be covered by the isolation pattern 120), and an upper active pattern 105a (not covered by the isolation pattern 120 but protruding therefrom).

Figure 8:
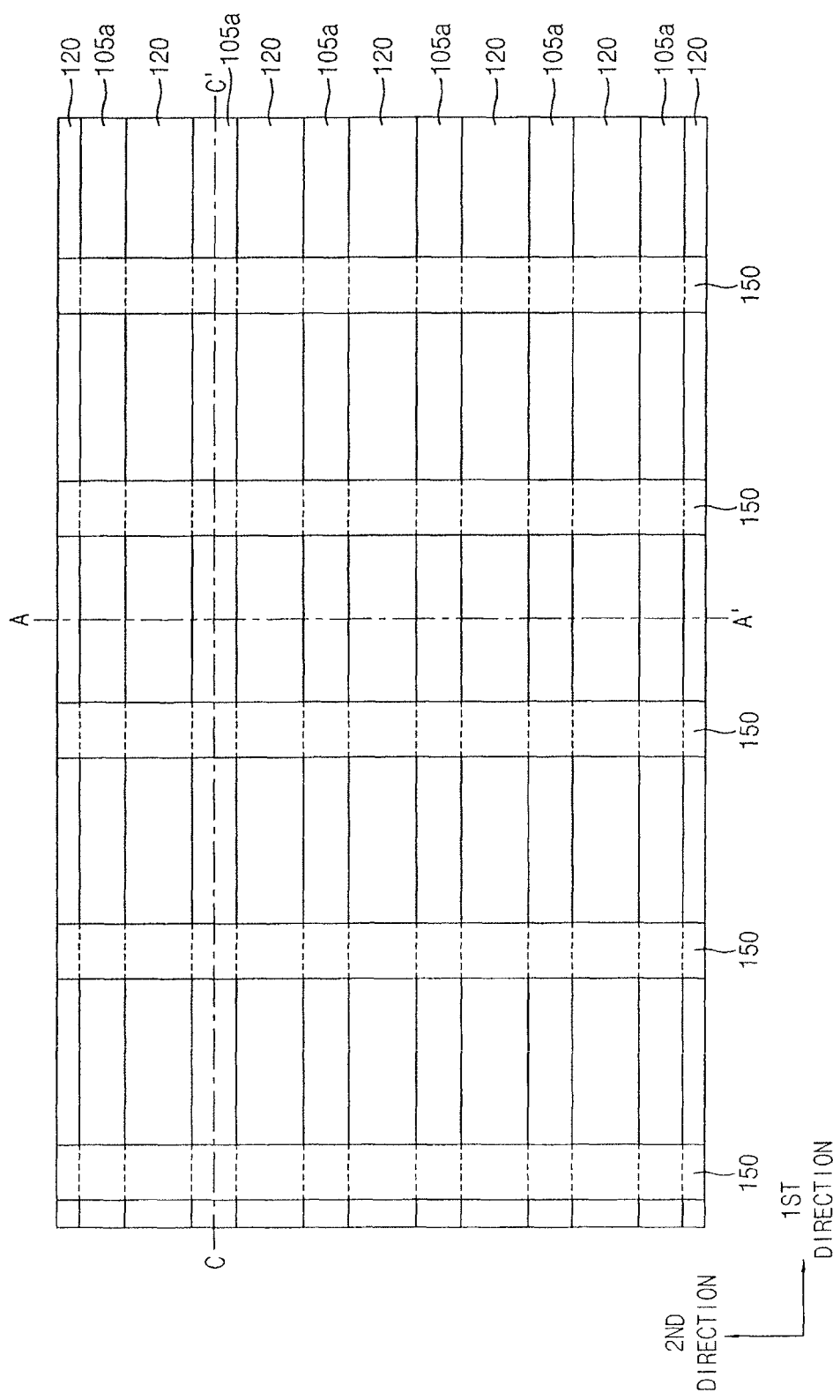
Figure 10:
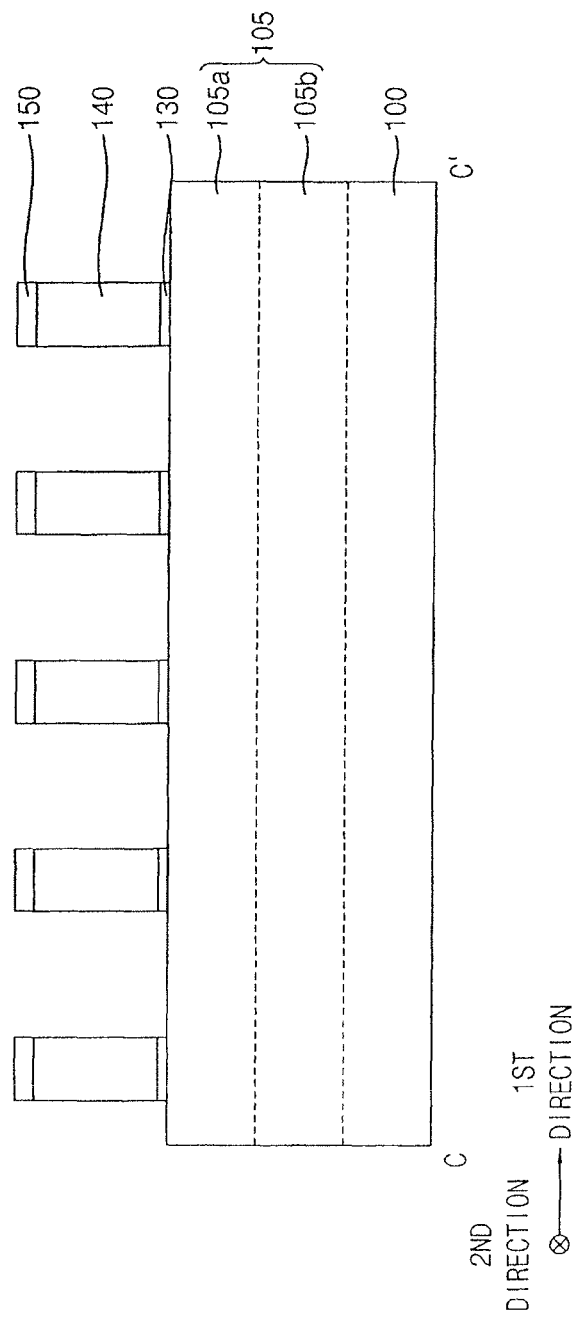

Referring to FIGS. 8 to 10, a dummy gate structure may be formed on the substrate 100.

For example, the dummy gate structure may be formed by sequentially forming a dummy gate insulation layer, a dummy gate electrode layer and a dummy gate mask layer on the substrate 100 and the isolation pattern 120, patterning the dummy gate mask layer to form a dummy gate mask 150, and sequentially etching the dummy gate electrode layer and the dummy gate insulation layer using the dummy gate mask 150 as an etching mask.

Thus, the dummy gate structure may include a dummy gate insulation pattern 130, a dummy gate electrode 140, and the dummy gate mask 150 sequentially stacked on the substrate 100.

The dummy gate insulation layer may be formed by, e.g., a chemical vapor deposition (CVD) process, an atomic layer deposition (ALD) process, etc. In an implementation, the dummy gate insulation layer may be formed by a thermal oxidation process on an upper portion of the substrate 100, and in this case, the dummy gate insulation layer may be formed only on the upper active pattern 105a.

In an implementation, the dummy gate structure may extend in the second direction, and a plurality of dummy gate structures may be formed in the first direction.

Figure 11:
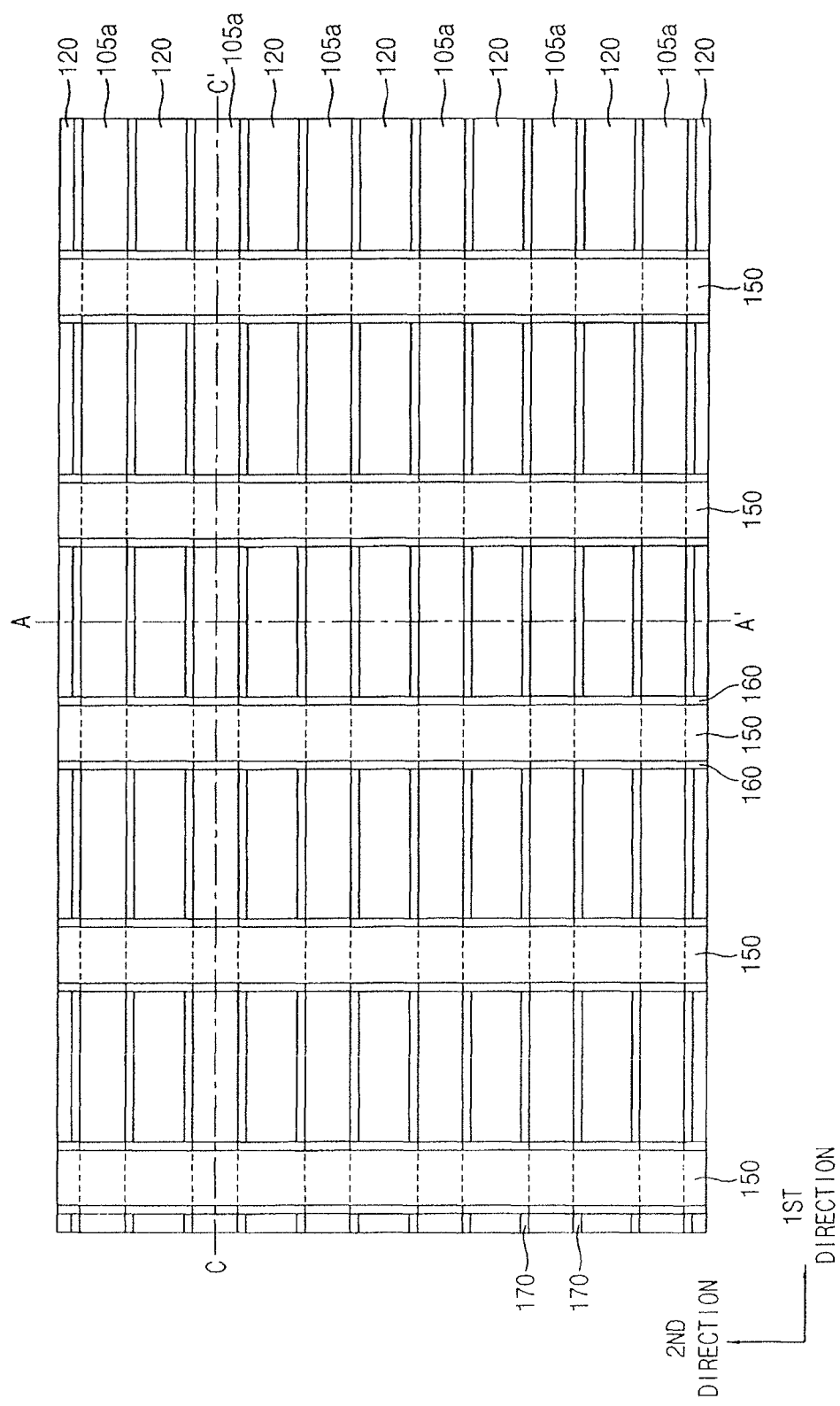
Figure 12:
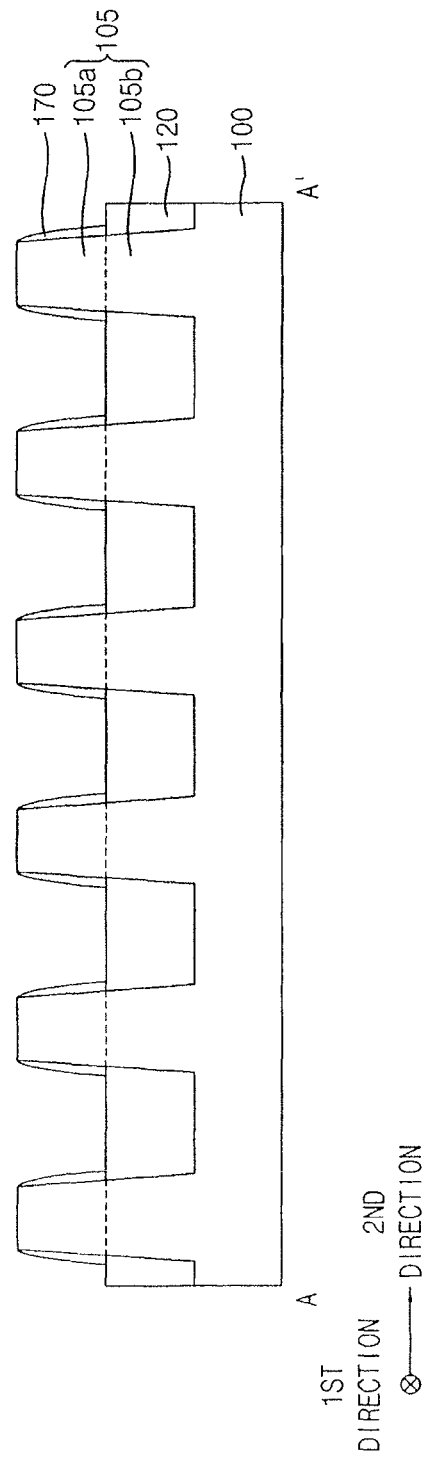
Figure 13:
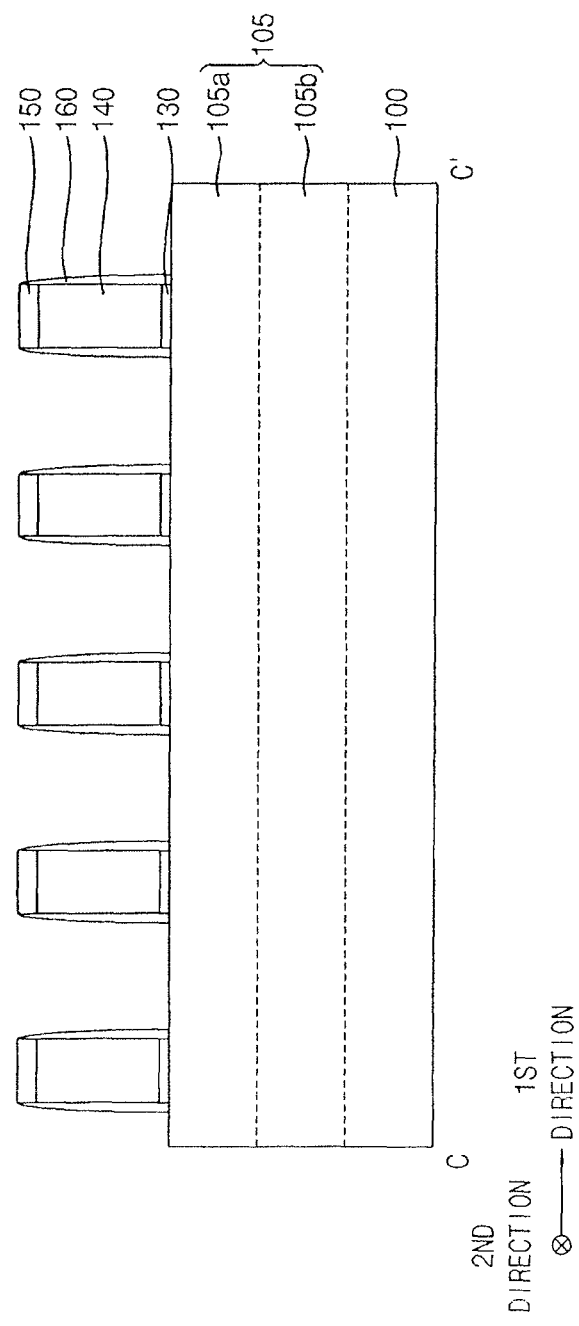

Referring to FIGS. 11 to 13, a gate spacer 160 may be formed on a sidewall of the dummy gate structure.

The gate spacer 160 may be formed by forming a spacer layer on the active fin 105 and the isolation pattern 120 to cover the dummy gate structure, and anisotropically etching the spacer layer. The gate spacer 160 may be formed on each of opposite sidewalls of the dummy gate structure in the first direction, and a fin spacer 170 may be also formed on each of opposite sidewalls of the upper active pattern 105a in the second direction.

Figure 14:
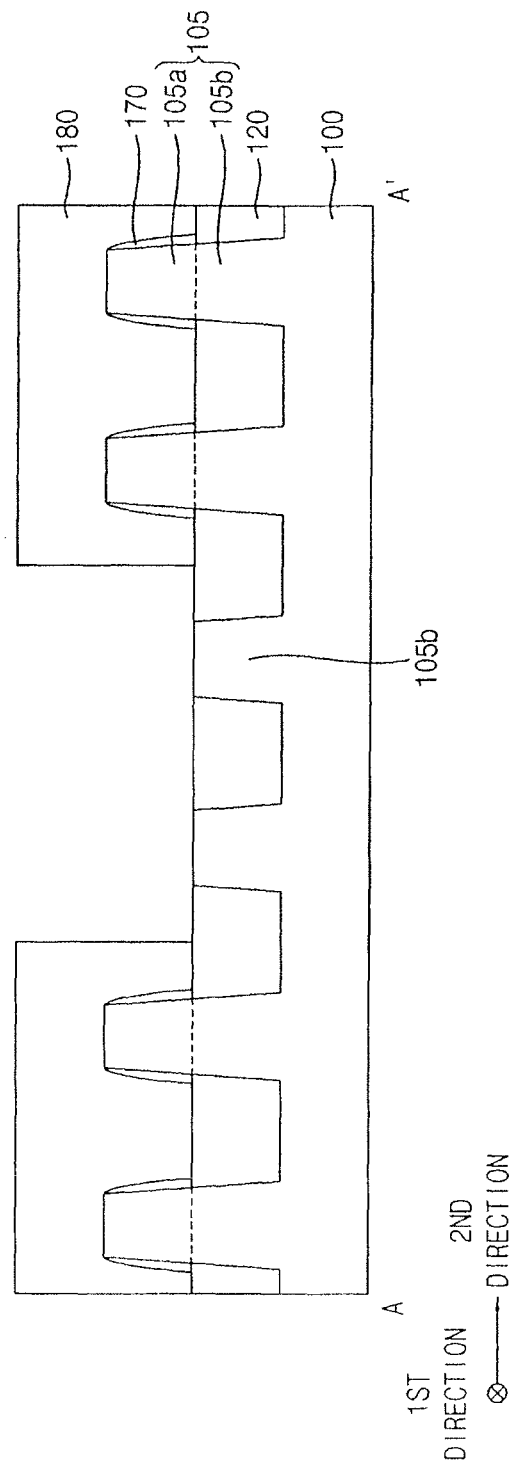

Referring to FIG. 14, a first mask 180 may be formed to cover some of the active fins 105 and expose other ones of the active fins 105, and the upper active patterns 105a of the exposed active fins 105 may be removed using the first mask 180 as an etching mask to form dummy active fins including only the lower active patterns 105b, respectively.

In an implementation, the first mask 180 may expose one or more active fins 105, and thus one or more dummy active fins may be formed. In an implementation, as shown in FIG. 14, the upper active patterns 105a of neighboring two active fins 105 may be removed to form two dummy active fins.

When the dummy active fins are formed, the fin spacers 170 on the sidewalls of the upper active patterns 105a (of the dummy fins) may be also removed.

Figure 15:
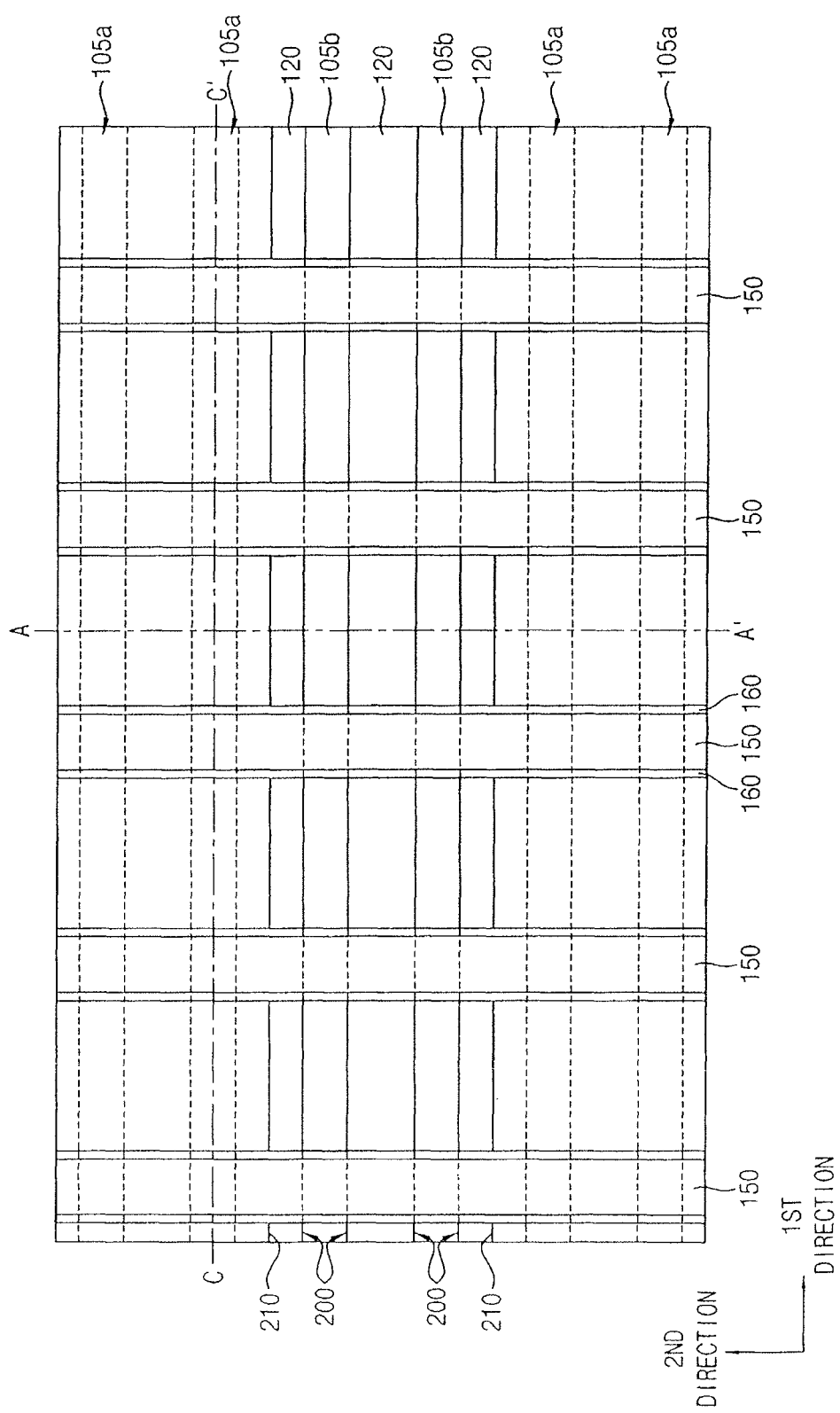
Figure 16:
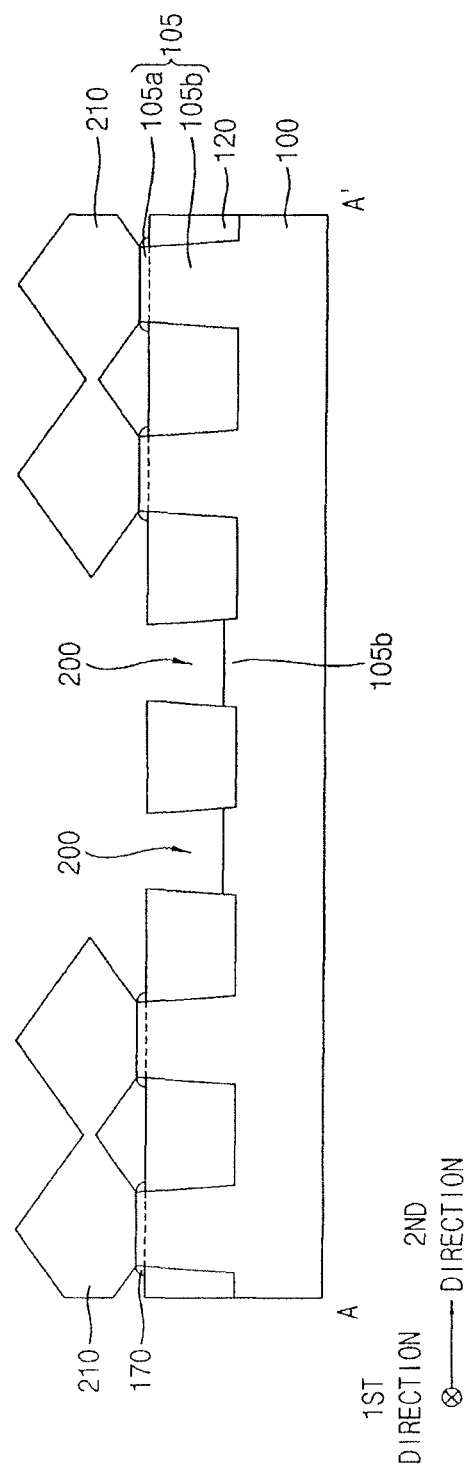
Figure 17:
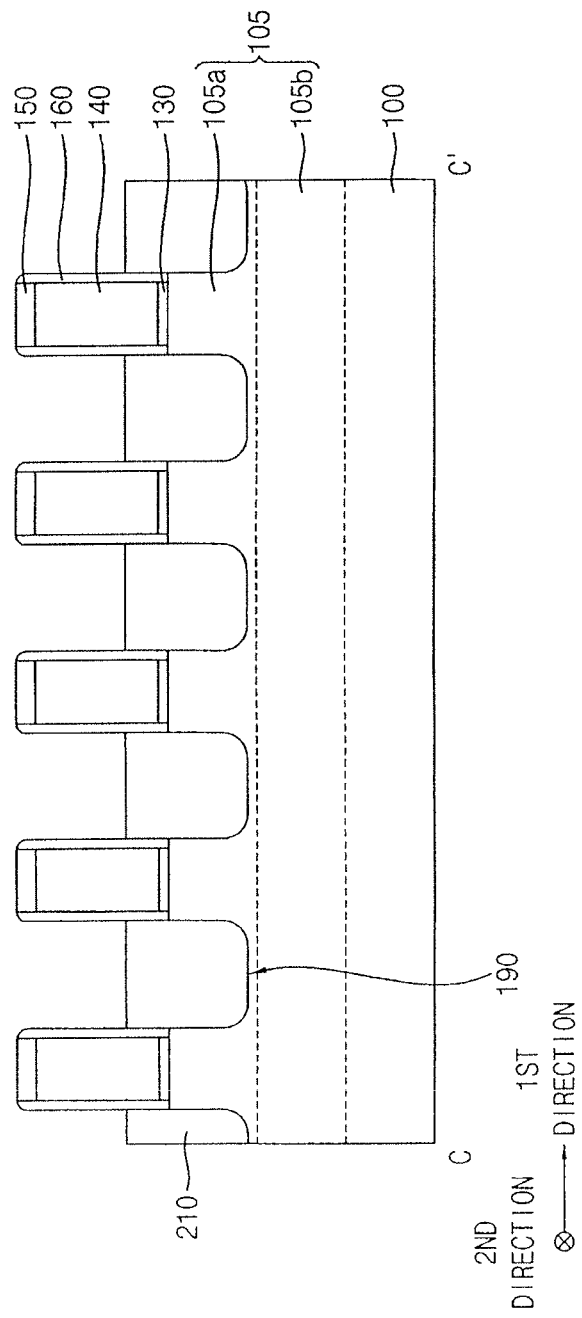
Figure 18:
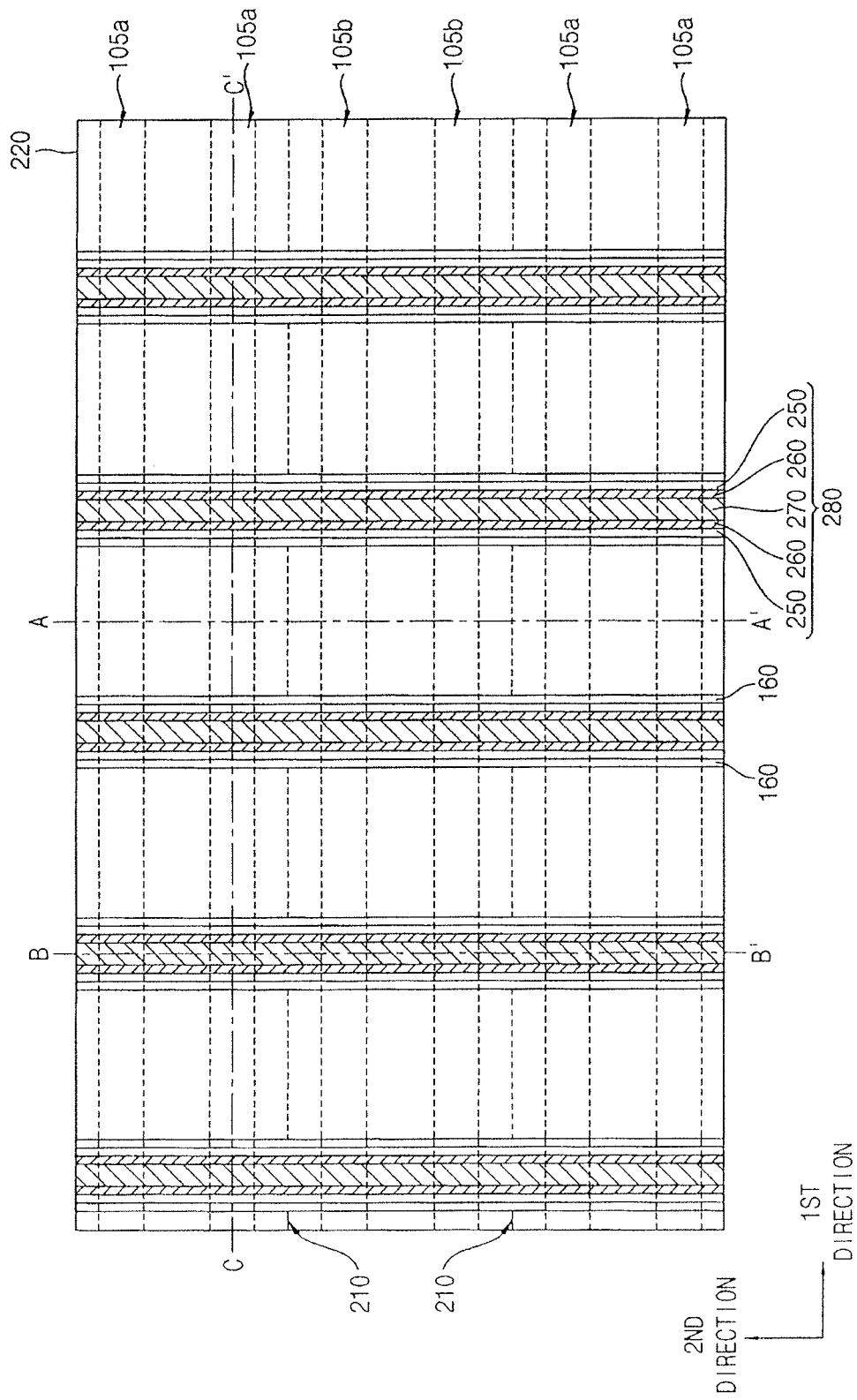
Figure 19:
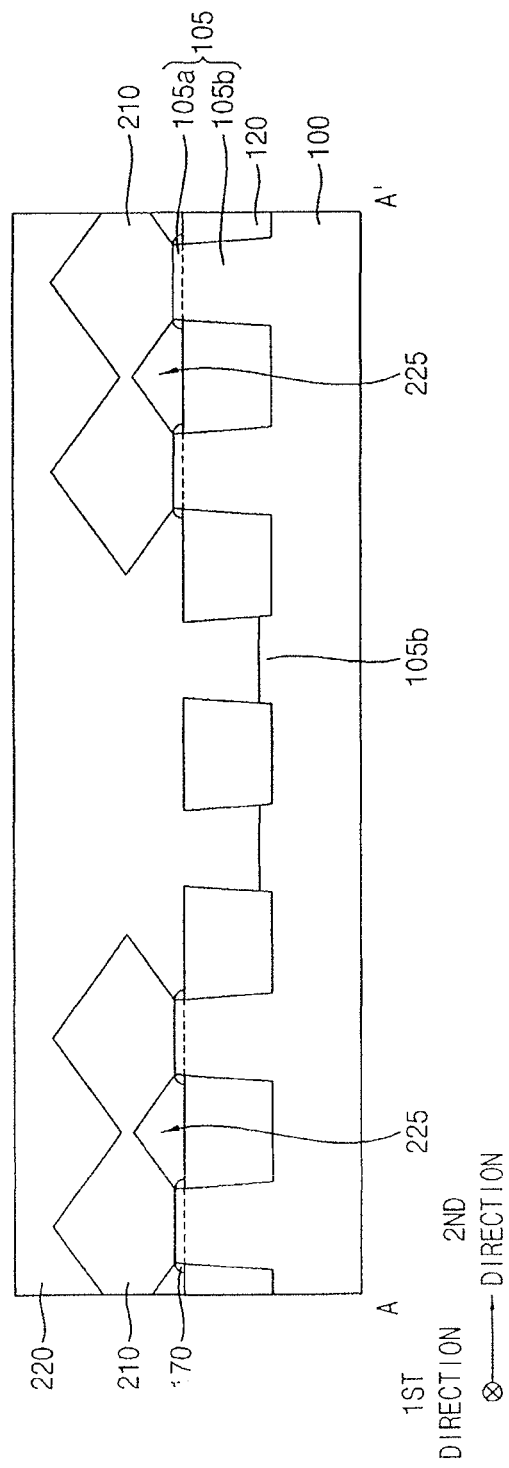

Referring to FIGS. 15 to 17, after removing the first mask 180, an upper portion of the active fin 105 adjacent the gate spacer 160 may be etched to form a second recess 190.

For example, the upper portion of the active fin 105 may be removed by a dry etching process using the dummy gate structure and the gate spacer 160 on a sidewall thereof as an etching mask to form the second recess 190. When the second recess 190 is formed, the fin spacer 170 adjacent the active fin 105 may be mostly removed, and only a lower portion of the fin spacer 170 may remain. The lower active patterns 105b of the dummy active fins may be also partially or entirely removed to form a third recess 200.

In an implementation, as shown in the figures, as a portion of the upper active pattern 105a is etched to form the second recess 190, a bottom of the second recess 190 may be higher than a top surface of the lower active pattern 105b.

After forming a second mask to fill the third recess 200, a source/drain layer 210 may be formed to fill the second recess 190.

In an implementation, the source/drain layer 210 may be formed by a selective epitaxial growth (SEG) process using an upper surface of the active fin 105 exposed by the second recess 190 as a seed.

In an implementation, as the SEG process is performed, a single crystalline silicon-germanium layer may be formed to serve as the source/drain layer 210. Additionally, a p-type impurity source gas may be also used to form a single crystalline silicon-germanium layer doped with p-type impurities serving as the source/drain layer 210. Thus, the source/drain layer 210 may serve as a source/drain region of a PMOS transistor.

The source/drain layer 210 may grow not only in a vertical direction but also in a horizontal direction to fill the second recess 190, and may contact a sidewall of the gate spacer 160.

In an implementation, when the active fins 105 disposed in the second direction are close to each other, the source/drain layers 210 growing on the respective active fins 105 may be merged with each other. In an implementation, as shown in FIGS. 15 to 17, two source/drain layers 210 grown on neighboring two active fins 105 may be merged with each other. In an implementation, more than two source/drain layers 210 may be merged with each other.

In an implementation, the source/drain layer 210 may serve as the source/drain region of the PMOS transistor. In an implementation, the source/drain layer 210 may also serve as a source/drain region of an NMOS transistor.

In an implementation, a single crystalline silicon carbide layer may be formed as the source/drain layer 210. In the SEG process, an n-type impurity source gas may be also used to form a single crystalline silicon carbide layer doped with n-type impurities.

Referring to FIGS. 18 to 21, after removing the second mask, an insulation layer 220 may be formed on the substrate 100 to cover the dummy gate structure, the gate spacer 160, the fin spacer 170, and the source/drain layer 210, and may be planarized until the dummy gate electrode 140 of the dummy gate structure is exposed.

In the planarization process, the dummy gate mask 150 may be also removed, and an upper surface of the gate spacer 160 may be removed. A space between the merged source/drain layers 210 and the isolation pattern 120 may not be filled with the insulation layer 220, and thus an air gap 225 may be formed.

The planarization process may be performed by, e.g., a chemical mechanical polishing (CMP) process and/or an etch back process.

The exposed dummy gate electrode 140 and the dummy gate insulation pattern 130 thereunder may be removed to form a first opening 230 exposing an inner sidewall of the gate spacer 160 and an upper surface of the active fin 105, and a gate structure 280 may be formed to fill the first opening 230.

The gate structure 280 may be formed by the following processes.

After performing a thermal oxidation process on the exposed upper surface of the active fin 105 exposed by the first opening 230 to form an interface pattern 240, a gate insulation layer and a work function control layer may be sequentially formed on the interface pattern 240, the isolation pattern 120, the gate spacer 160, and the insulation layer 220, and a gate electrode layer may be formed on the work function control layer to sufficiently fill a remaining portion of the first opening 230.

The interface pattern 240 may be formed instead of the thermal oxidation process, by a CVD process, an ALD process, or the like, similarly to the gate insulation layer or the gate electrode layer. In this case, the interface pattern 240 may be formed not only on the upper surface of the active fin 105 but also on the upper surface of the isolation pattern 120 and the inner sidewall of the gate spacer 160.

The gate electrode layer, the work function control layer, and the gate insulation layer may be planarized until an upper surface of the insulation layer 220 may be exposed to form a gate insulation pattern 250 and a work function control pattern 260 sequentially stacked on the interface pattern 240, the isolation pattern 120, and the inner sidewall of the gate spacer 160, and a gate electrode 270 filling the remaining portion of the first opening 230 on the work function control pattern 260.

The interface pattern 240, the gate insulation pattern 250, the work function control pattern 260 and the gate electrode 270 sequentially stacked may form the gate structure 280, and the gate structure 280 together with the source/drain layer 210 may form a PMOS transistor or an NMOS transistor according to the conductivity type of the source/drain layer 210.

Figure 22:
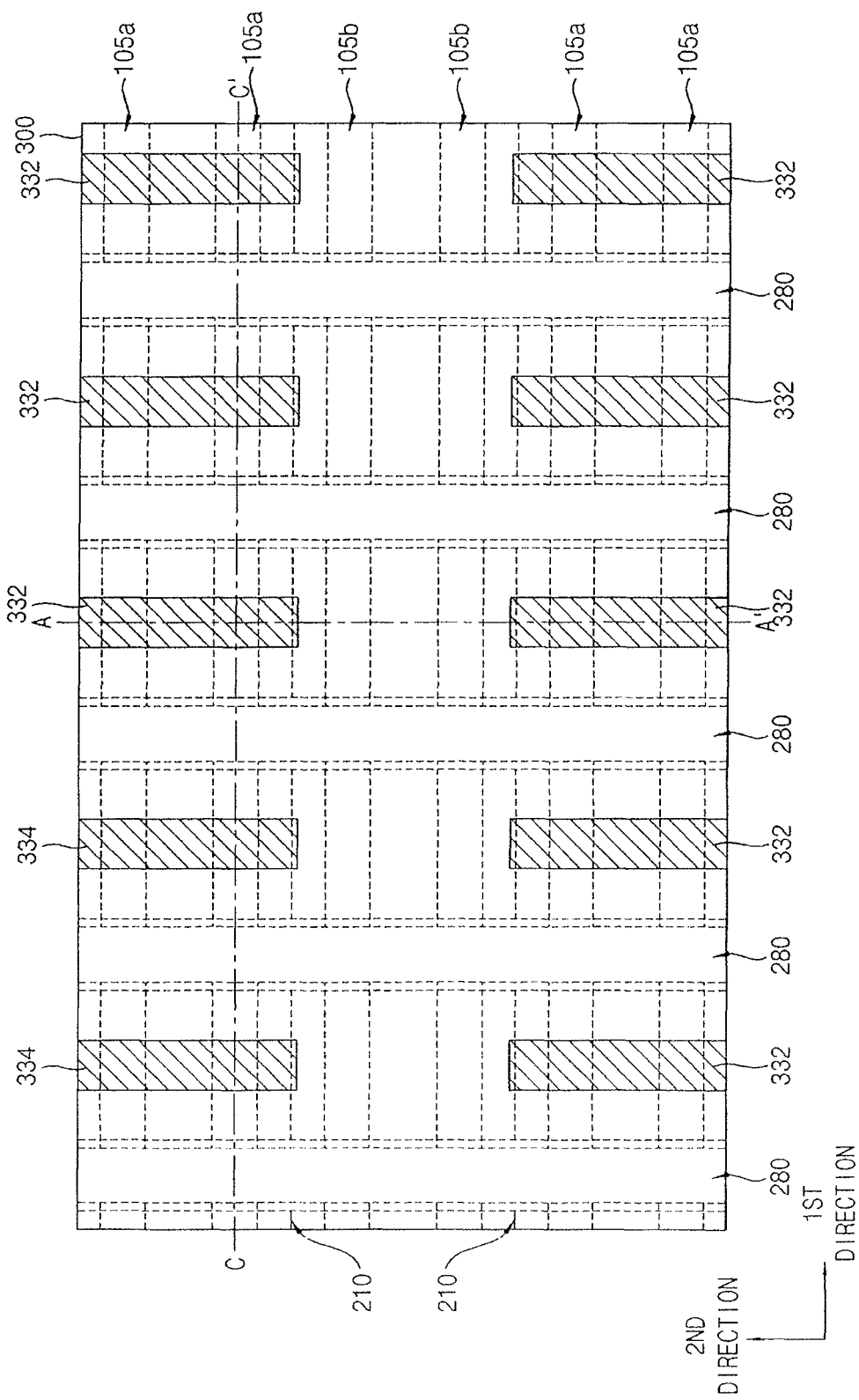
Figure 23:
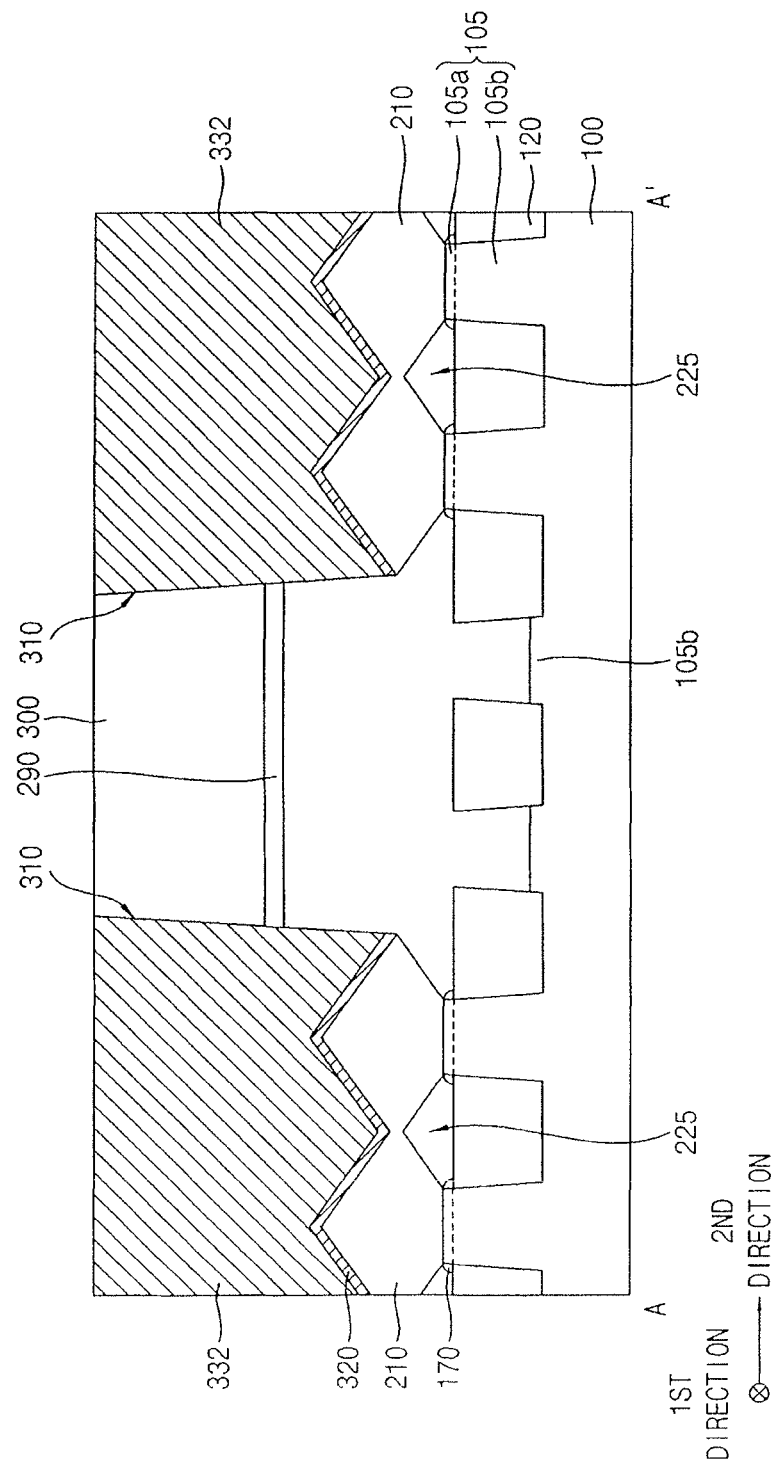
Figure 24:
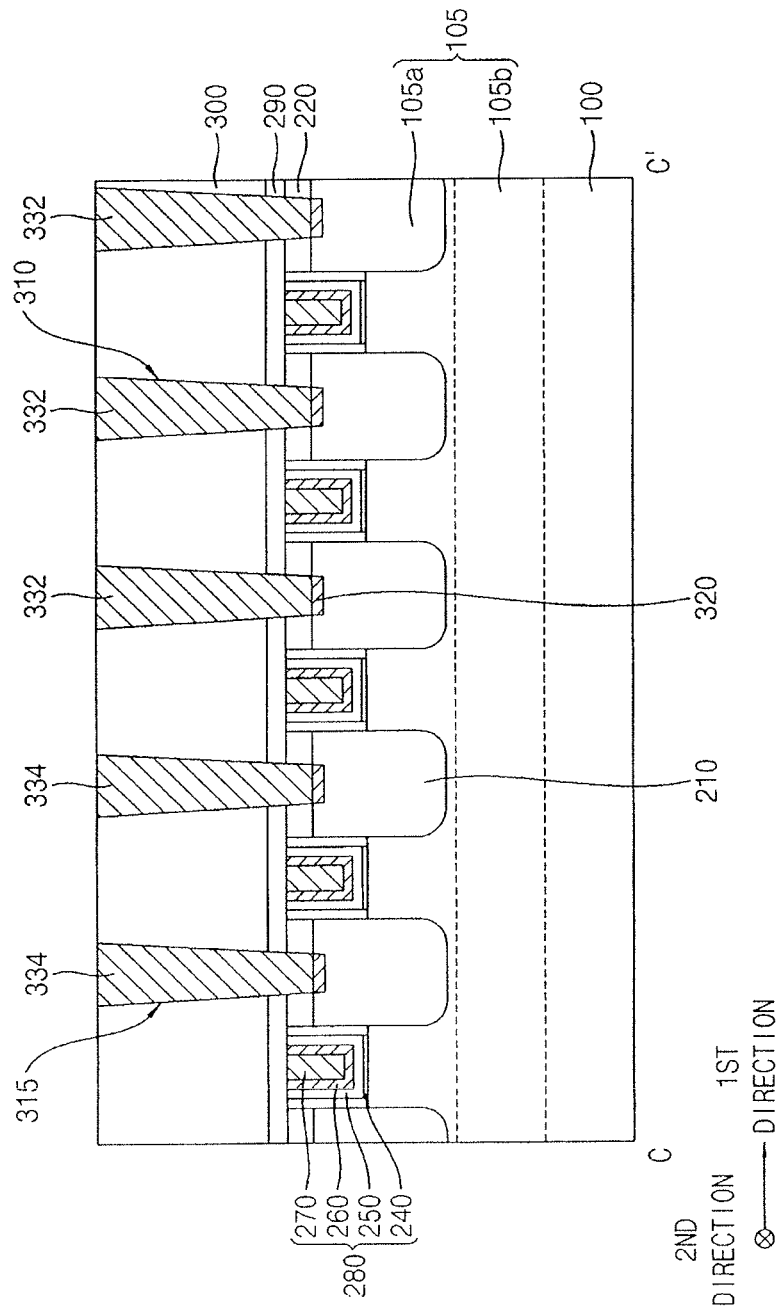
Figure 25:
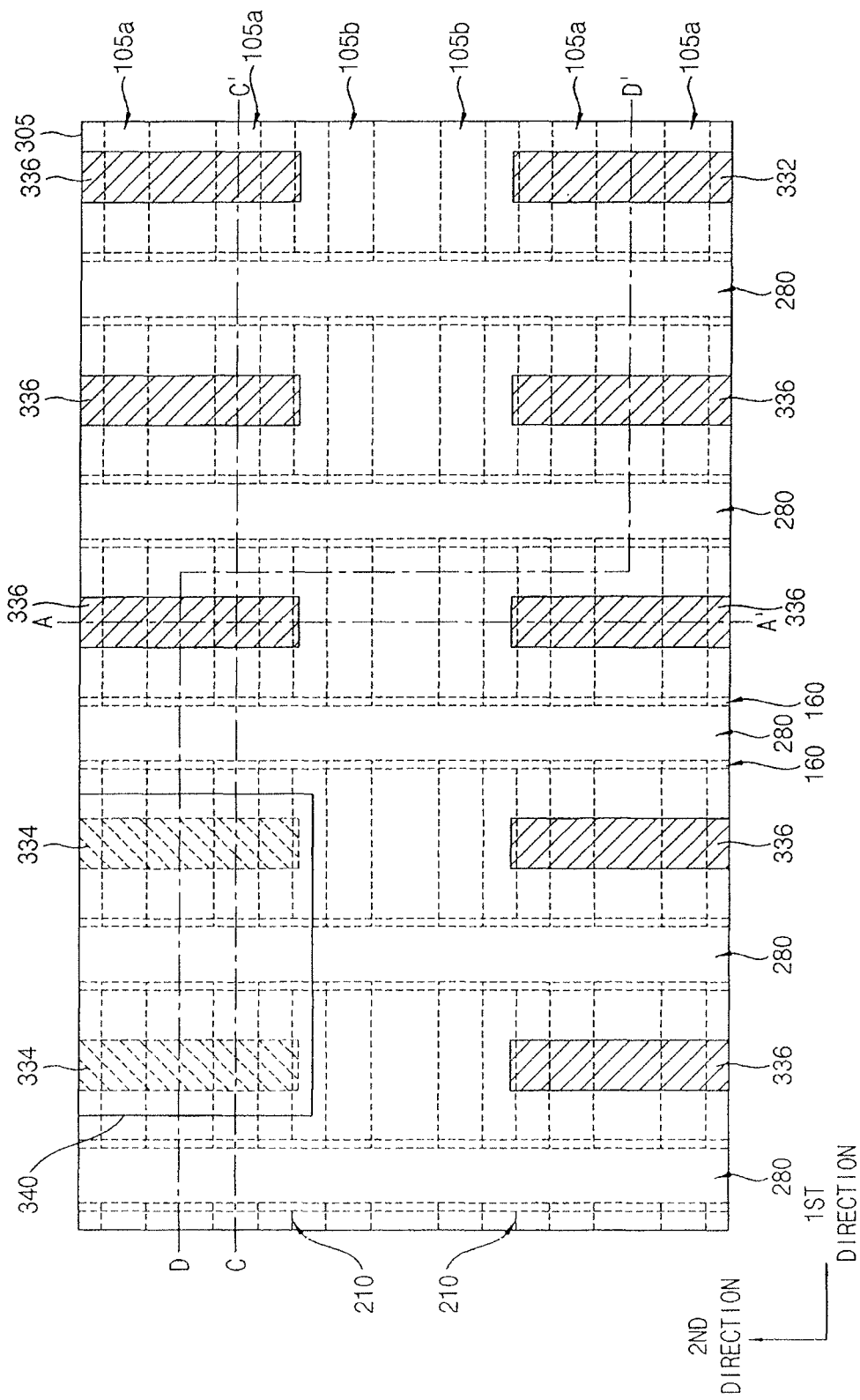
Figure 26:
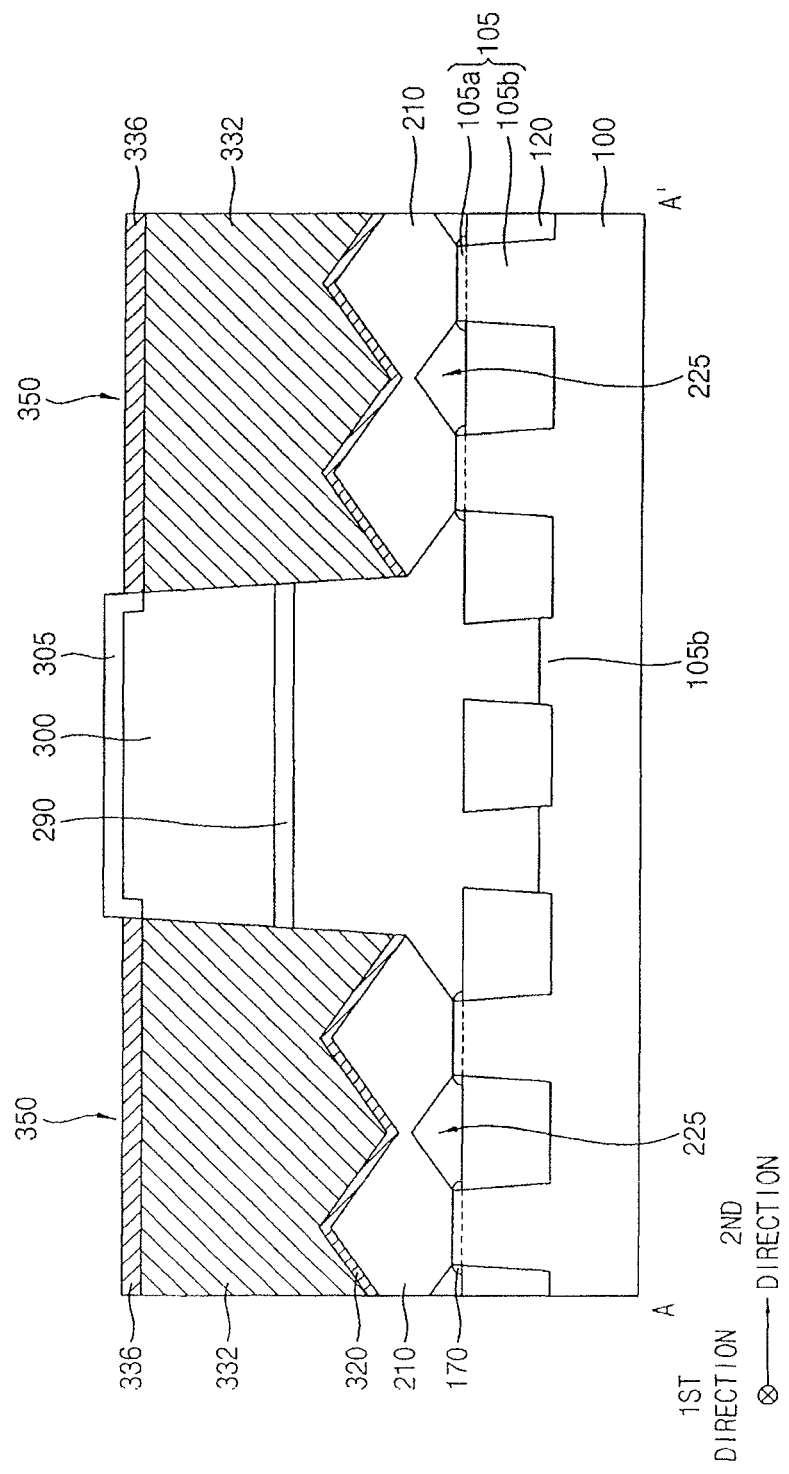
Figure 27:
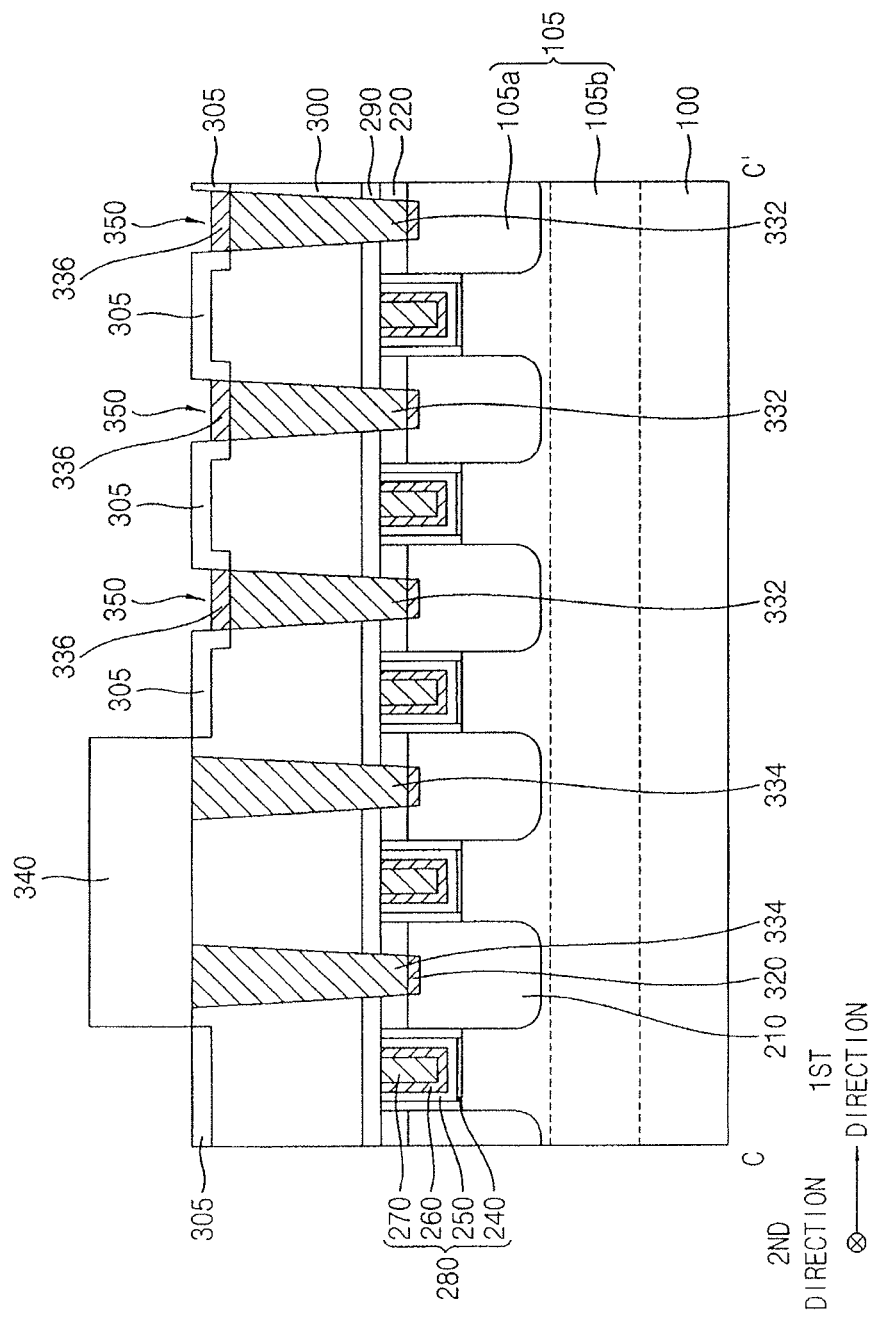
Figure 28:
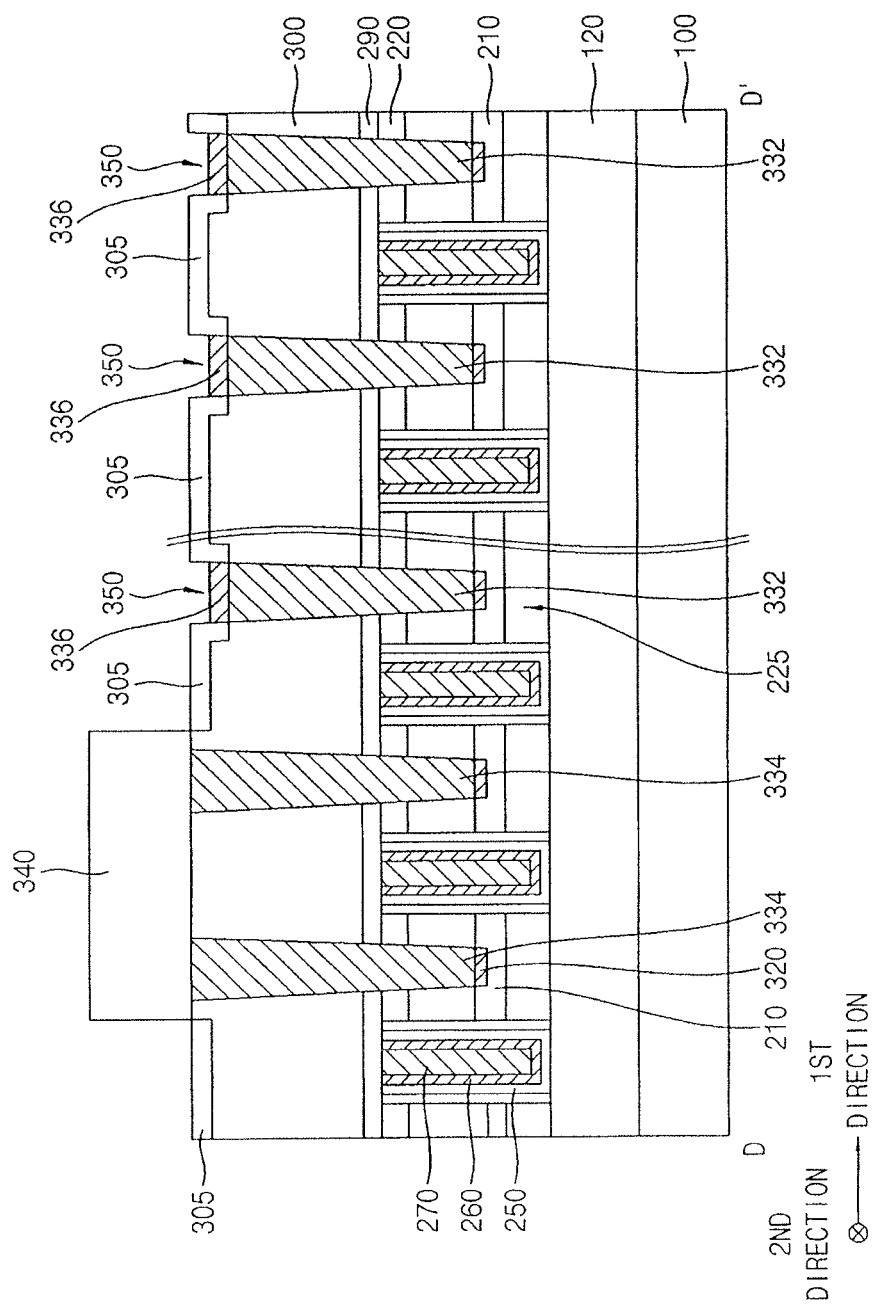

Referring to FIGS. 22 to 24, a capping layer 290 and a first insulating interlayer 300 may be sequentially formed on the insulation layer 220, the gate structure 280, and the gate spacer 160, and first and second contact plugs 332 and 334 may be formed through the insulation layer 220, the capping layer 290, and the first insulating interlayer 300 to contact upper surfaces of the source/drain layers 210.

The first and second contact plugs 332 and 334 may be formed, e.g., by following processes.

Second and third openings 310 and 315 may be formed through the insulation layer 220, the capping layer 290 and the first insulating interlayer 300 to expose the upper surfaces of the source/drain layers 210, a first metal layer may be formed on the exposed upper surfaces of the source/drain layers 210, sidewalls of the second and third openings 310 and 315, and the upper surface of the first insulating interlayer 300, and a heat treatment process may be performed thereon to form a first metal silicide pattern 320 on each of the source/drain layers 210.

In an implementation, each of the second and third openings 310 and 315 may be formed to have a high aspect ratio, and a width of each of the second and third openings 310 and 315 may decrease from a top toward a bottom thereof.

A first barrier layer may be formed on the first metal silicide pattern 320, the sidewalls of the second and third openings 310 and 315, and the upper surface of the first insulating interlayer 300, a second metal layer may be formed on the first barrier layer to fill the second and third openings 310 and 315, and the second metal layer and the first barrier layer may be planarized until the upper surface of the first insulating interlayer 300 are exposed.

Thus, the first and second contact plugs 332 and 334 may be formed on the first metal silicide pattern 320 to fill the second and third openings 310 and 315, respectively.

Each of the first and second contact plugs 332 and 334 may include a second metal pattern and a first barrier pattern covering a lower surface and a sidewall of the second metal pattern.

In an implementation, the first and second contact plugs 332 and 334 may be formed on the source/drain layers 210 on the active fins 105, and thus may not vertically overlap the dummy active fins having only the remaining lower active patterns 105b.

Each of the first contact plugs 332 may extend in the second direction to a given length, and a plurality of first contact plugs 332 may be formed in the first direction. The second contact plug 334 may extend in the second direction to a given length, and one or more than one second contact plugs 334 may be formed in the first direction. In the figure, two second contact plugs 334 are shown.

As illustrated above, each of the second and third openings 310 and 315 may have a width decreasing from a top toward a bottom thereof, and thus each of the first and second contact plugs 332 and 334 filling each of the second and third openings 310 and 315 may have a width decreasing from a top toward a bottom thereof.

Referring to FIGS. 25 to 28, a third mask 340 may be formed on the first insulating interlayer 300 to cover the second contact plug 334, and an upper portion of each of the first contact plugs 332 may be removed to form a fourth recess 350.

In each of the first contact plugs 332, an upper portion may have a width greater than a lower portion, and the upper portion of each of the first contact plugs 332 may be removed to form the fourth recess 350. Thus, a distance between the first contact plugs 332 may increase.

An ion implantation process may be performed using the third mask 340 as an ion implantation mask to implant ions into an upper portion of the first insulating interlayer 300, and an insulation reinforcing layer 305 may be formed.

In an implementation, the ions may include silicon ion, and when the first insulating interlayer 300 includes silicon oxide, a silicon-rich silicon oxide layer may be formed as the insulation reinforcing layer 305. In an implementation, the insulation reinforcing layer 305 may include other types of materials.

In an implementation, the insulation reinforcing layer 305 may be formed on an upper surface of the first insulating interlayer 300 to a uniform thickness. Due to the formation of the fourth recesses 350, the upper surface of the first insulating interlayer 300 may not have a constant height, and thus the insulation reinforcing layer 305 may have a varying height.

By the ion implantation process, ions may be also implanted into upper portions of the first contact plugs 332, e.g., when silicon ion is implanted, a second metal silicide pattern 336 may be formed on each of the first contact plugs 332.

Figure 29:
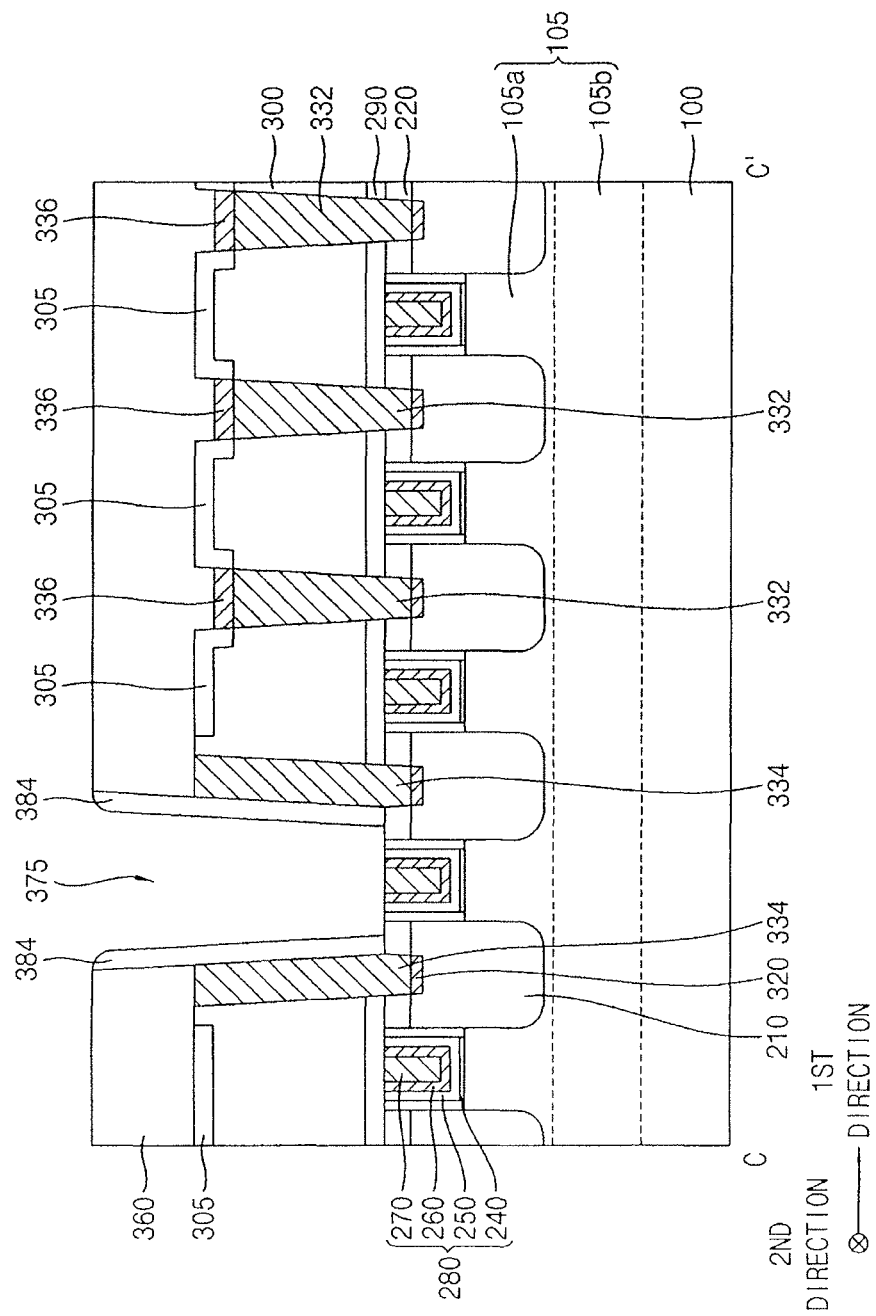
Figure 30:
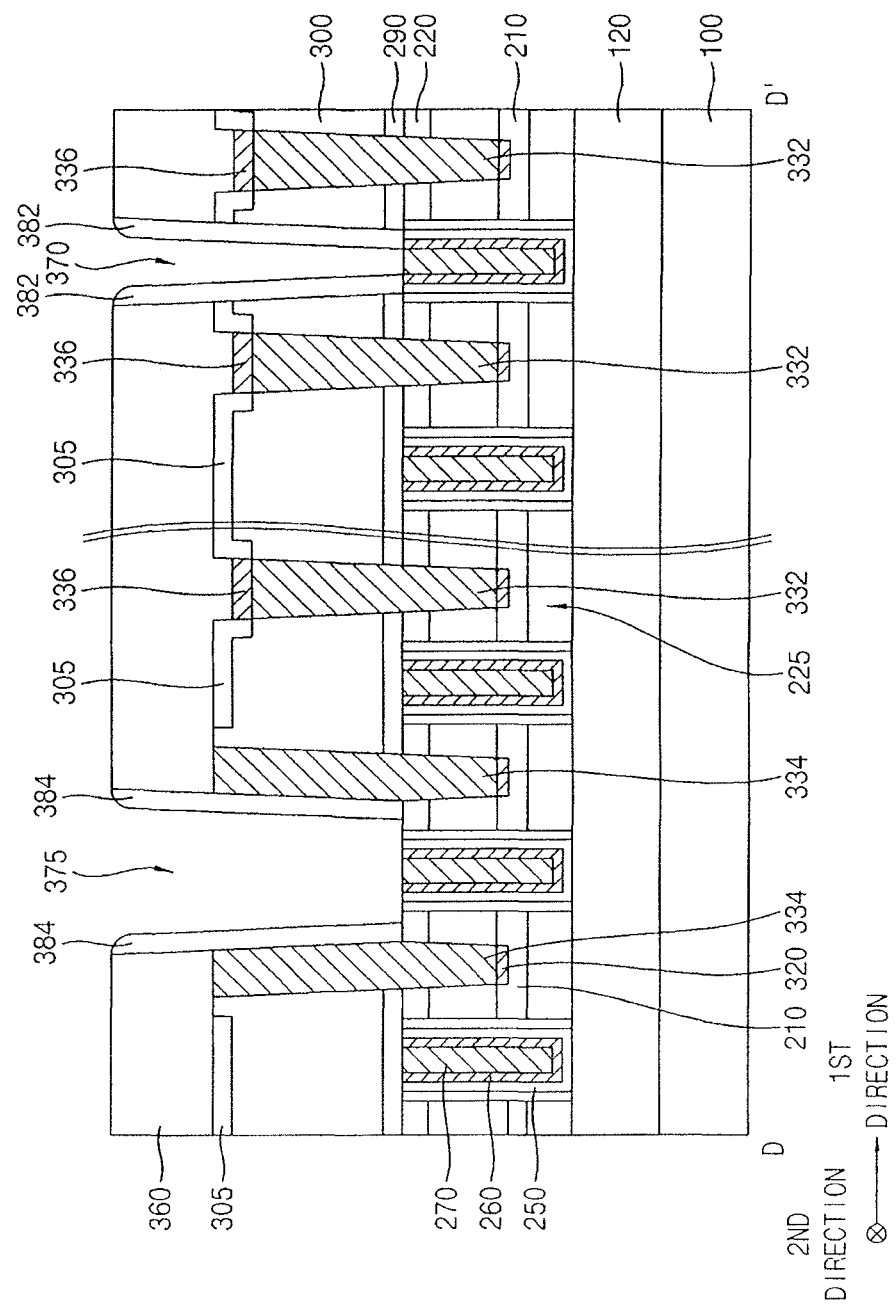

Referring to FIGS. 29 and 30, after removing the third mask 340, a second insulating interlayer 360 may be formed on the first insulating interlayer 300 on which the insulation reinforcing layer 305 is formed, the first contact plugs 332 on which the second metal silicide patterns 336 are formed, and the second contact plug 334.

A fourth opening 370 may be formed through the second insulating interlayer 360, the first insulating interlayer 300 on which the insulation reinforcing layer 305 is formed, and the capping layer to expose an upper surface of one of the gate structures 280, and a fifth opening 375 may be formed through the second insulating interlayer 360, the first insulating interlayer 300, a portion of the second contact plug 334, and the capping layer to expose an upper surface of at least one of the gate structures 280.

In an implementation, the fourth opening 370 may be formed between neighboring ones of the first contact plugs 332 in the first direction on the source/drain layers 210 at opposite sides of the gate structure 280, and thus may not vertically overlap the dummy active fin.

In an implementation, the fifth opening 375 may expose a sidewall of the second contact plug 334, e.g., when two second contact plugs 334 are formed at opposite sides of the gate structure 280 in the first direction, the fifth opening 375 may expose respective sidewalls of the two second contact plugs 334.

First and second insulating spacers 382 and 384 may be formed on sidewalls of the fourth and fifth openings 370 and 375, respectively. Thus, a sidewall of the second contact plug 334 exposed by the fifth opening 375 may be covered by the second insulating spacer 384.

In an implementation, the first and second insulating spacers 382 and 384 may be formed by forming an insulating spacer layer on bottoms and sidewalls of the fourth and fifth openings 370 and 375, and on the second insulating interlayer 360, and anisotropically etching the insulating spacer layer.

The insulating spacer layer may be formed of an oxide, e.g., silicon oxide.

In an implementation, each of the first and second insulating spacers 382 and 384 may have a hollow cylindrical shape.

Figure 31:
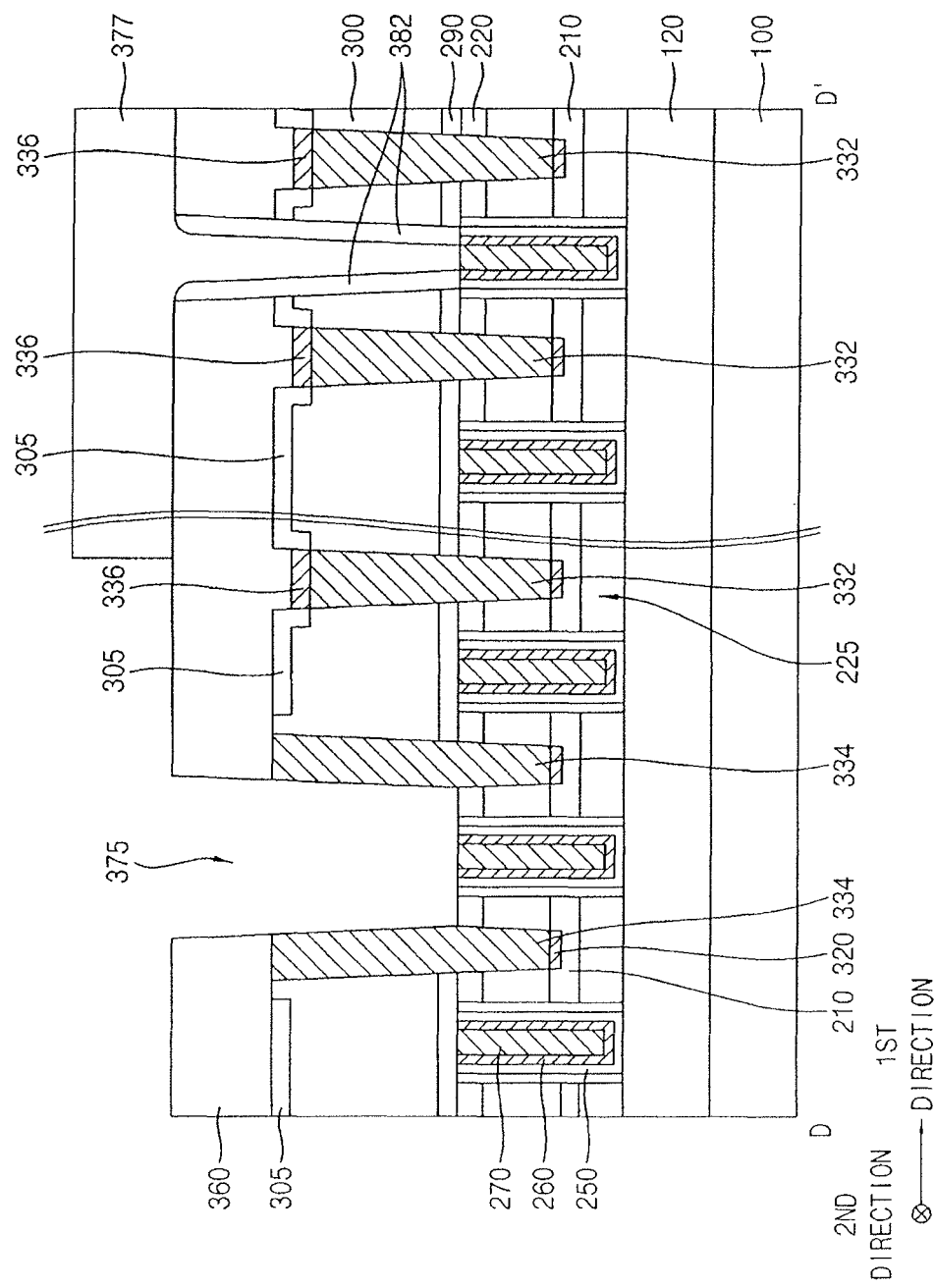

Referring to FIG. 31, after forming a fourth mask 377 on the second insulating interlayer 360 to cover the fourth opening 370, and the second insulating spacer 384 in the fifth opening 375 may be removed by an etching process using the fourth mask 377 as an etching mask.

Thus, the sidewall of the second contact plug 334 covered by the second insulating spacer 384 may be exposed.

Figure 32:
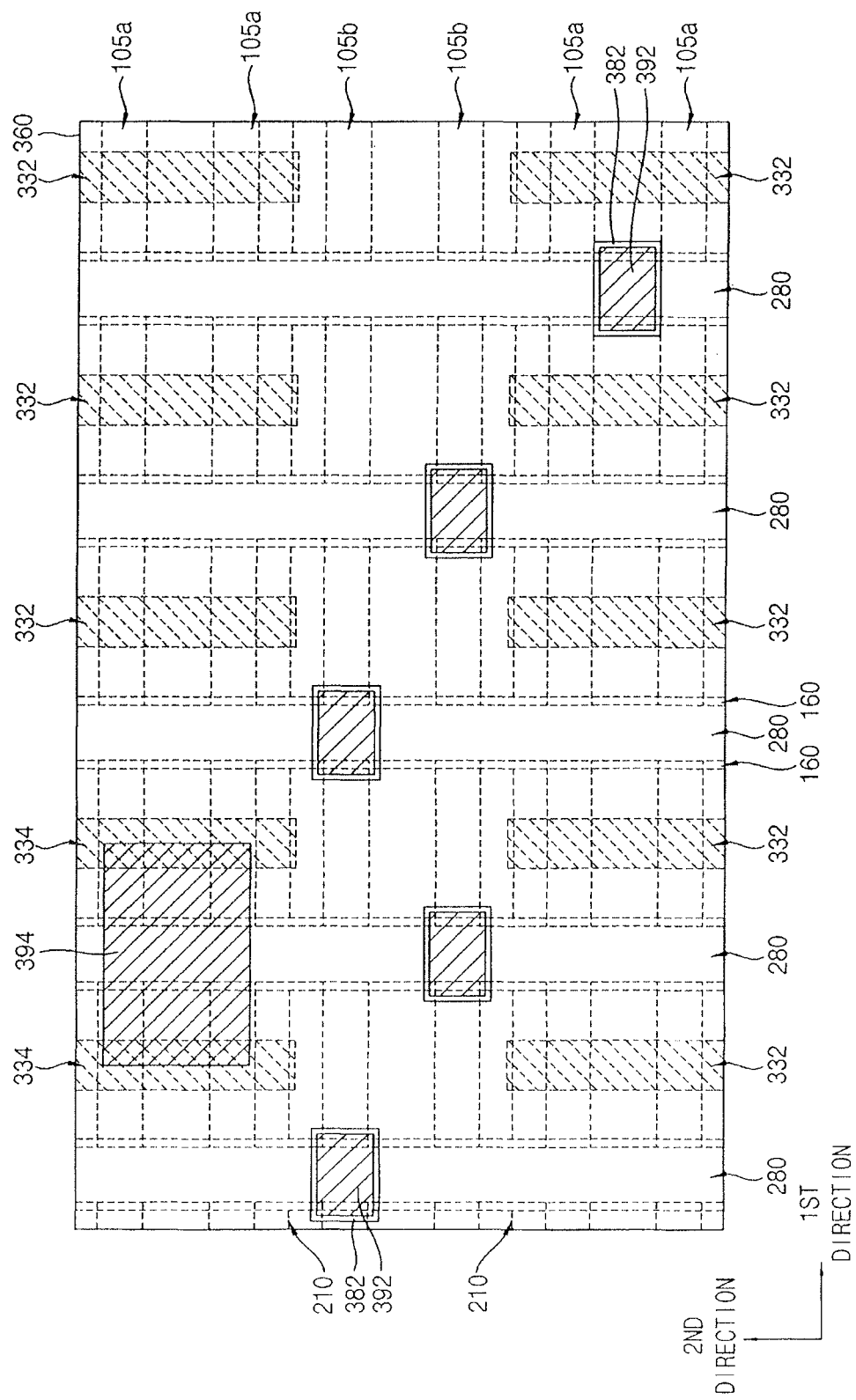
Figure 33:
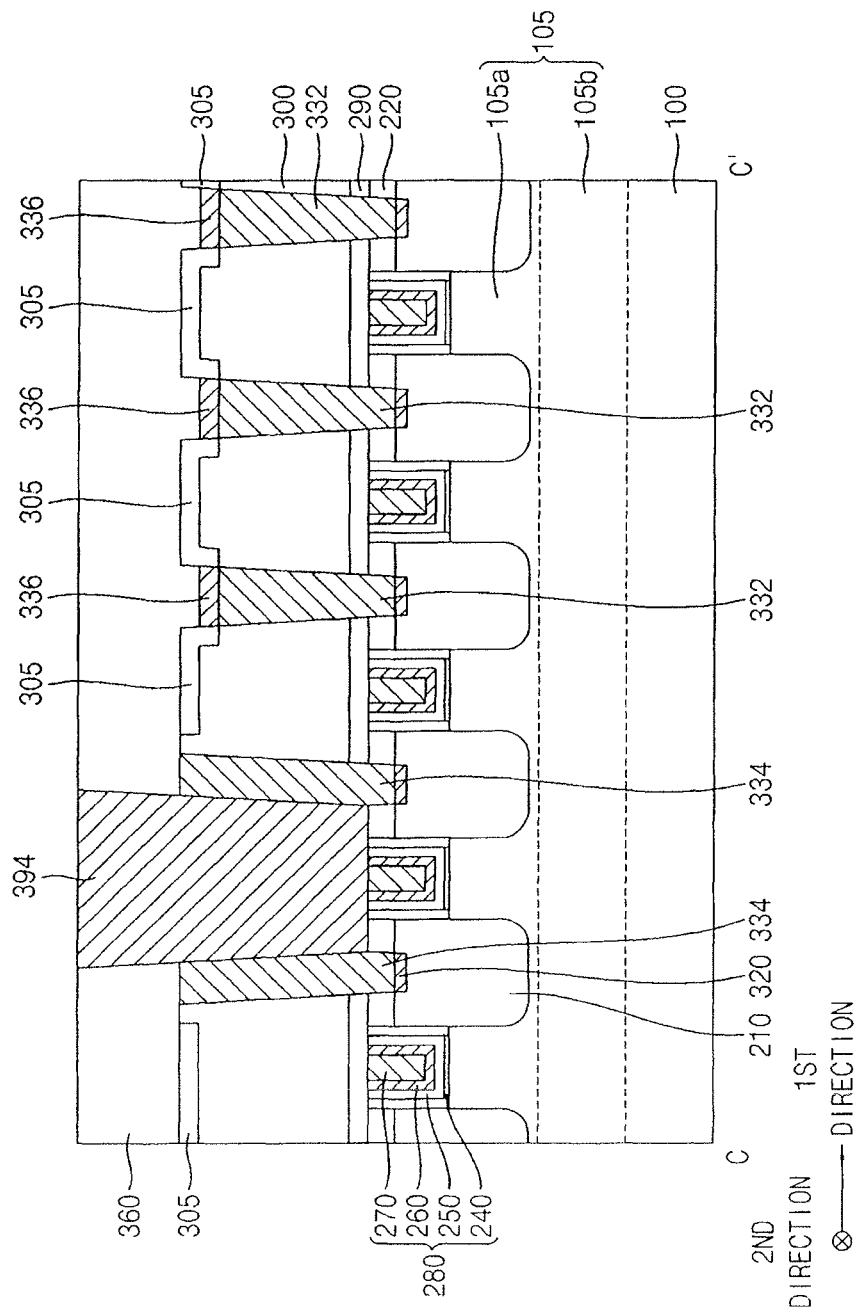
Figure 34:
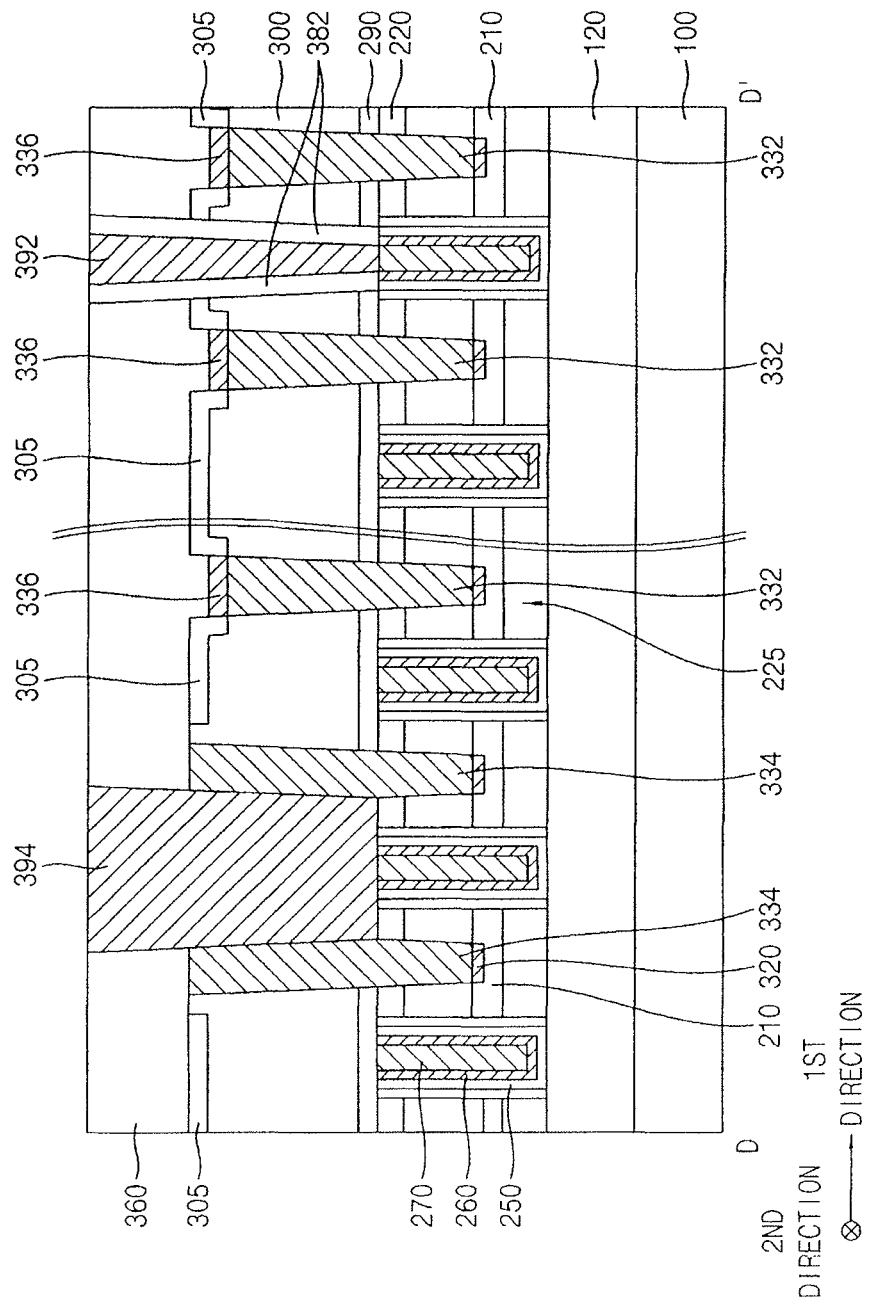

Referring to FIGS. 32 to 34, third and fourth contact plugs 392 and 394 may be formed to fill the fourth and fifth openings 370 and 375, respectively.

In an implementation, the third and fourth contact plugs 392 and 394 may be formed by forming a second barrier layer on a bottom of the fourth opening 370, the first insulating spacer 382, a bottom and a sidewall of the fifth opening 375, and the second insulating interlayer 360, forming a third metal layer on the second barrier layer to fill the fourth and fifth openings 370 and 375, and planarizing the third metal layer and the second barrier layer until an upper surface of the second insulating interlayer 360 is exposed.

Thus, the third contact plug 392 of which a sidewall may be covered by the first insulating spacer 382 may be formed on an upper surface of one of the gate structures 280, and the fourth contact plug 394 may be formed on an upper surface of at least one of the gate structures 280 to fill the fifth opening 375. Each of the third and fourth contact plugs 392 and 394 may include a third metal pattern and a second barrier pattern covering a lower surface and a sidewall of the third metal pattern.

In an implementation, the second barrier layer may be formed, and thus each of the third and fourth contact plugs 392 and 394 may include only the third metal pattern.

In an implementation, each of the third and fourth contact plugs 392 and 394 may be formed to be close the first and second contact plugs 332 and 334 in the first direction on the source/drain layers 210, and may not vertically overlap the dummy active fin including only the remaining lower active pattern 105b.

In an implementation, the third contact plug 392 may be formed between neighboring ones of the first contact plugs 332 in the first direction, and even if a misalignment were to occur during the formation of the fourth opening for forming the third contact plug 392, the sidewall of the third contact plug 392 may be covered by the first insulating spacer 382, and thus may be electrically insulated from the first contact plugs 332.

As the upper portions of the first contact plugs 332 having the relatively large width are removed, a distance between the third contact plug 392 and the first contact plugs 332 may increase, and thus the possibility that the first and third contact plugs 332 and 392 may contact each other may decrease.

Further, the insulation reinforcing layer 305 may be formed on the first insulating interlayer 300 through which the first contact plugs 332 are formed, and thus the electrical insulation between the first and third contact plugs 332 and 392 may be enhanced.

The second insulating spacer 384 on the sidewall of the fifth opening 375 may be removed so that a sidewall of the fourth contact plug 394 filling the fifth opening 375 and commonly contacting an upper surface of the gate structure 280 and the second contact plug 334 adjacent thereto may not be covered by an insulating spacer, unlike the third contact plug 392, and thus the contact resistance between the second and fourth contact plugs 334 and 394 may not increase.

Referring to FIGS. 1 to 5 again, a third insulating interlayer 400 may be formed on the second insulating interlayer 360, the third and fourth contact plugs 392 and 394, and the first insulating spacer 382, and wirings 420 may be formed in the third insulating interlayer 400 to be electrically connected to some of the first to fourth contact plugs 332, 334, 392 and 394.

In an implementation, each of the wirings 420 may extend in the first direction, and a plurality of wirings 420 may be formed in the second direction.

In an implementation, some of the wirings 420 may be electrically connected to the first contact plug 332, which may be possible through the first via 412 extending through the second and third insulating interlayers 360 and 400 and contacting lower surfaces of the ones of the wirings 420 and an upper surface of the first contact plug 332. Other ones of the wirings 420 may be electrically connected to the third contact plug 392, which may be possible through the second via 414 extending through the third insulating interlayer 400 and contacting lower surfaces of the other ones of the wirings 420 and an upper surface of the third contact plug 392.

In an implementation, the wirings 420 and the first and second vias 412 and 414 may be simultaneously formed by a dual damascene process. Thus, each of the wirings 420 and each of the first and second vias 412 and 414 may be formed to include a fourth metal pattern and a third barrier pattern covering a lower surface and a sidewall of the fourth metal pattern.

In an implementation, the wirings 420 and each of the first and second vias 412 and 414 may be formed by single damascene process independently.

Figure 35:
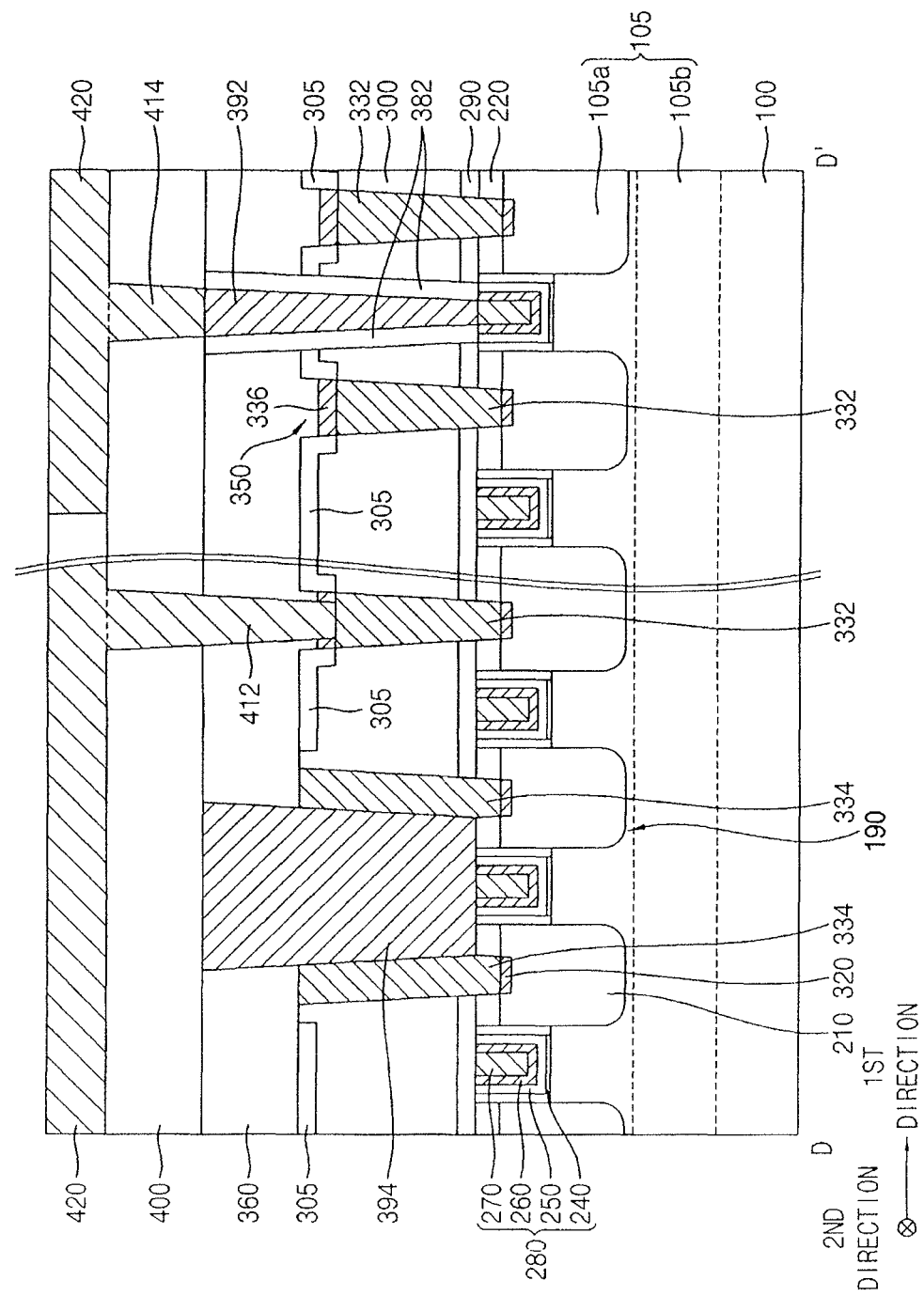
FIG. 35 illustrates a cross-sectional view of a semiconductor device in accordance with example embodiments.

FIG. 35 illustrates a cross-sectional view of a semiconductor device in accordance with example embodiments. This semiconductor device may be substantially the same as or similar to that of FIGS. 1 to 5, except for the locations of the first and second contact plugs. Thus, like reference numerals refer to like elements, and detailed descriptions thereon may be omitted below in the interest of brevity.

Referring to FIG. 35, each of the first and second contact plugs 332 and 334 may vertically overlap the active fin 105. In an implementation, as illustrated in FIGS. 1 to 5, each of the first and second contact plugs 332 and 334 may be formed on a merged portion of the merged source/drain layer 210 having grown on the neighboring active fins 105 and may vertically overlap the isolation pattern 120. In an implementation, as illustrated in FIG. 35, the first and second contact plugs 332 and 334 may contact an upper surface of the source/drain layer 210 directly on the active fin 105.

Figure 36:
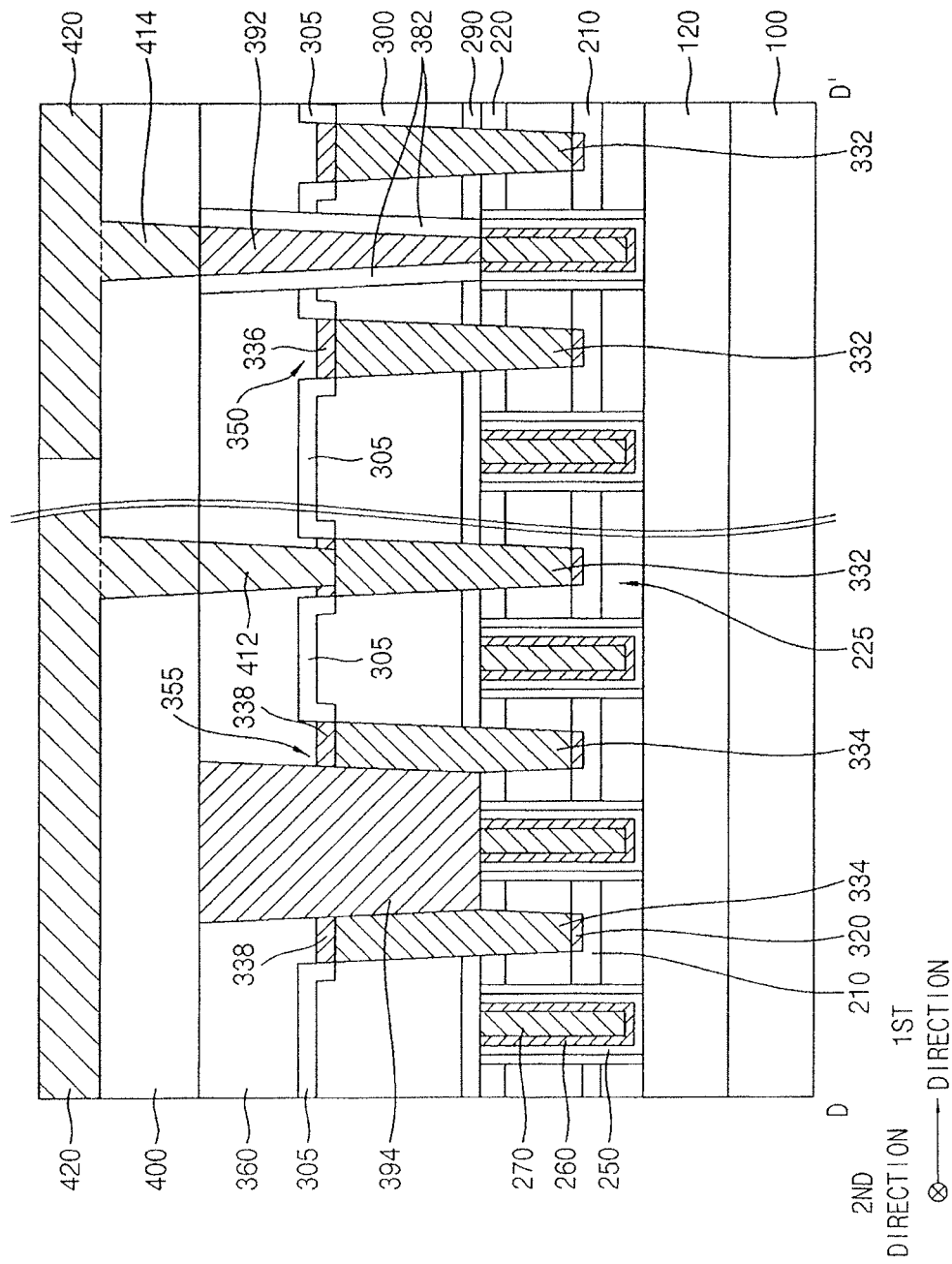
FIG. 36 illustrates a cross-sectional view of a semiconductor device in accordance with example embodiments.

FIG. 36 illustrates a cross-sectional view of a semiconductor device in accordance with example embodiments. This semiconductor device may be substantially the same as or similar to that of FIGS. 1 to 5, except for the first insulating interlayer and the second contact plug. Thus, like reference numerals refer to like elements, and detailed descriptions thereon may be omitted below in the interest of brevity.

Referring to FIG. 36, not only the fourth recess 350 but also a fifth recess 355 may be formed on the first insulating interlayer 300, and the second contact plug 334 may be formed under the fifth recess 355. Additionally, a third metal silicide pattern 338 may be formed on the second contact plug 334.

Figure 37:
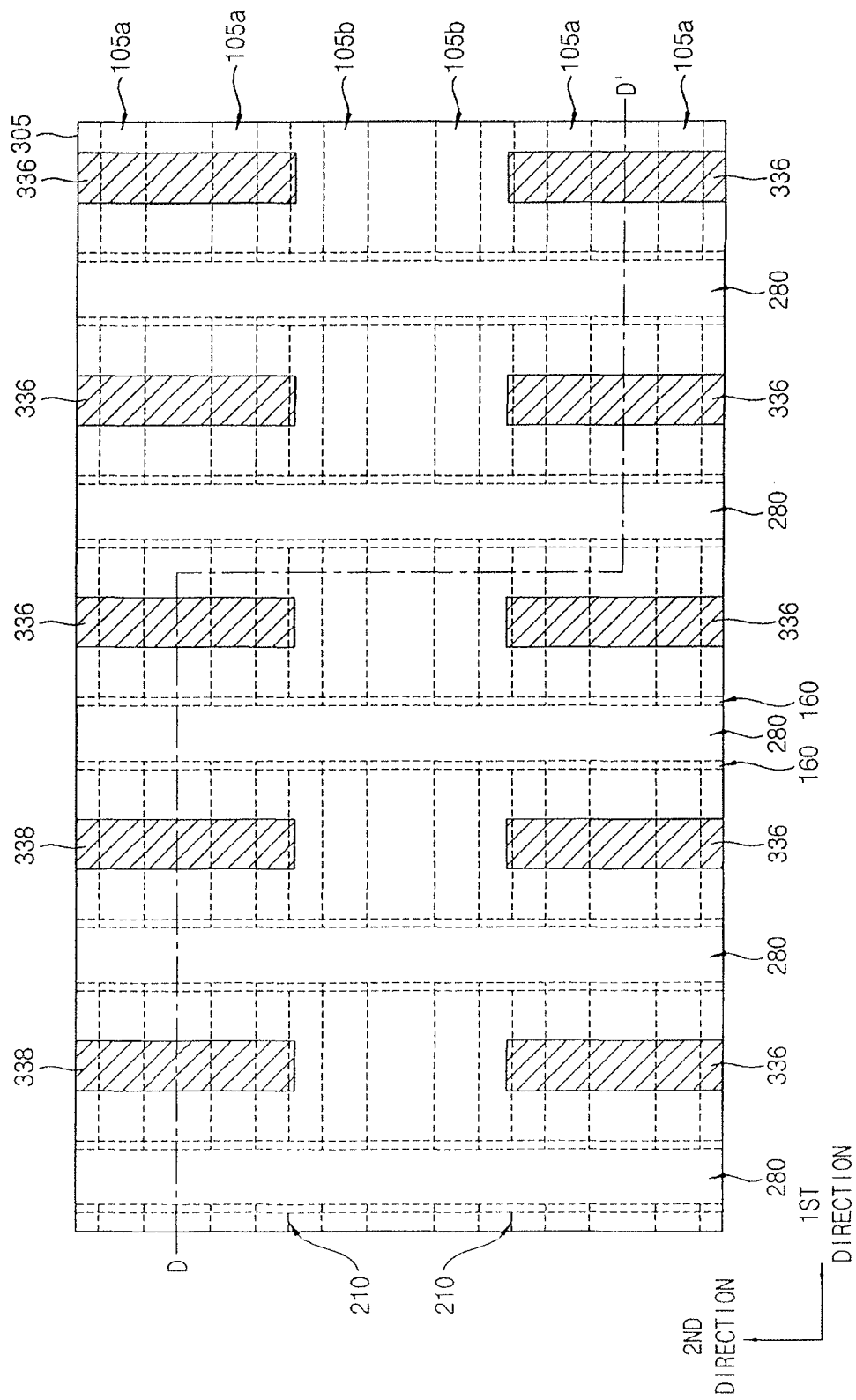
FIGS. 37 to 39 illustrate a plan view and cross-sectional views of stages in a method of manufacturing a semiconductor in accordance with example embodiments.
Figure 38:
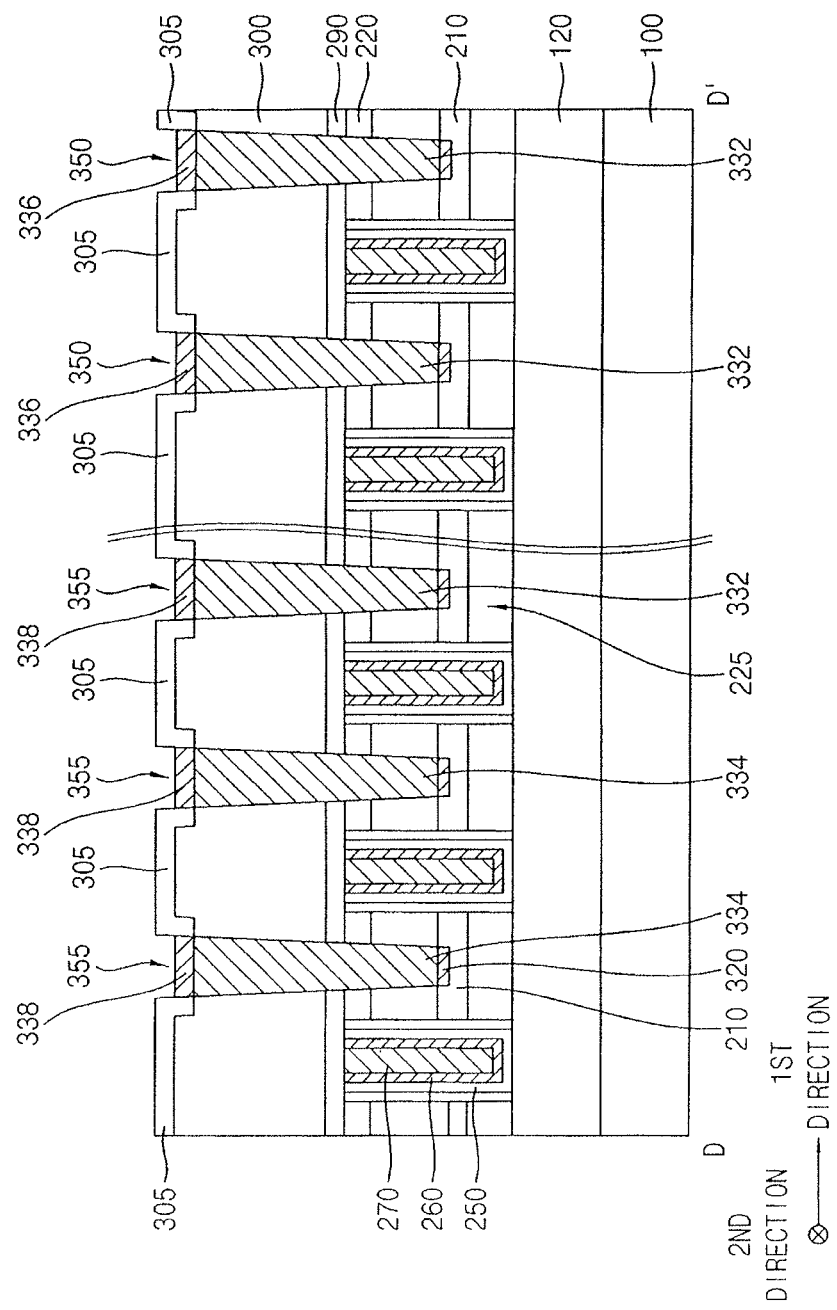
Figure 39:
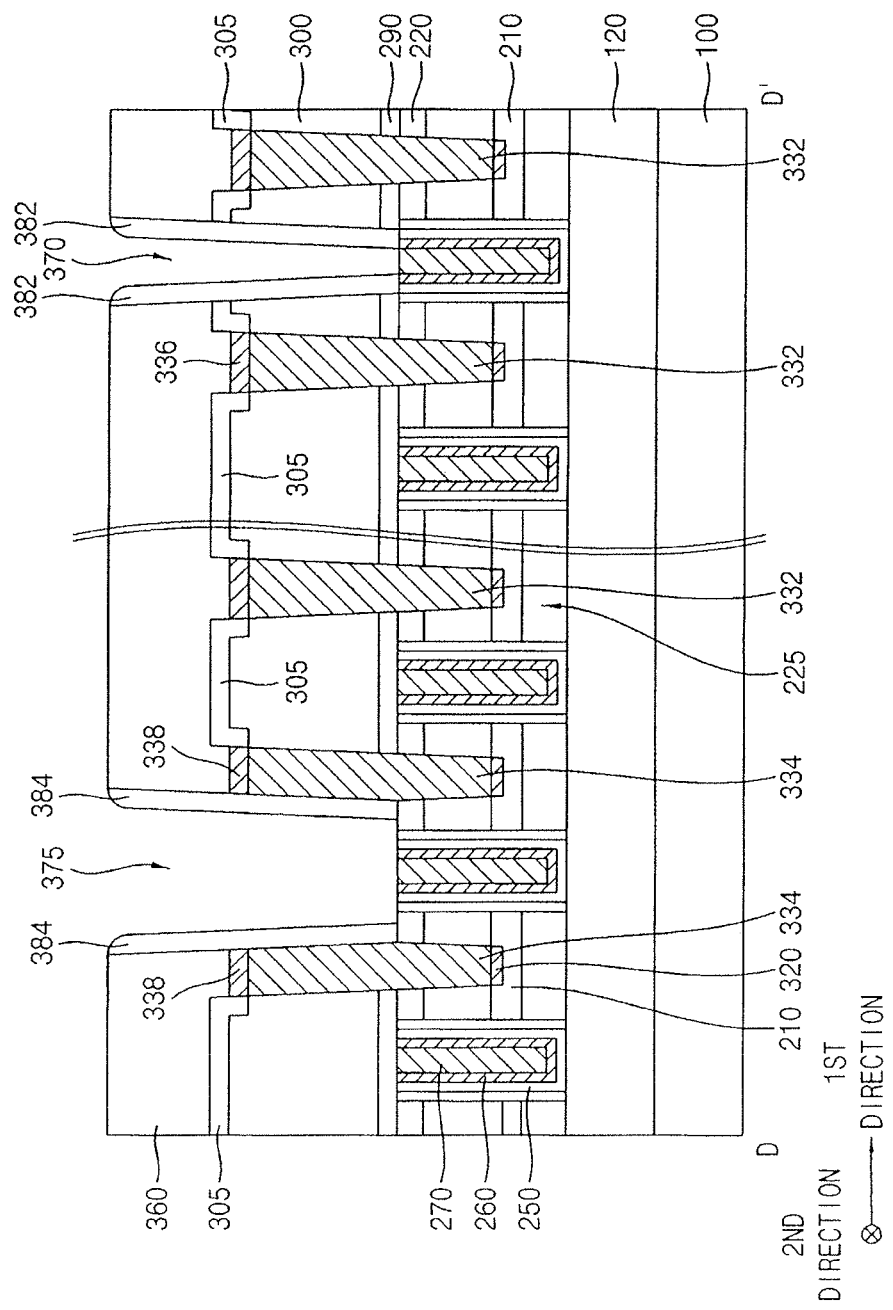

FIGS. 37 to 39 illustrate a plan view and cross-sectional views of stages in a method of manufacturing a semiconductor in accordance with example embodiments. For example, FIG. 37 is a plan view, and FIGS. 38 and 39 are cross-sectional views taken along lines D-D', respectively, of FIG. 37. This method may include processes substantially the same as or similar to those illustrated with reference to FIGS. 6 to 34, and detailed descriptions thereon are omitted herein.

First, processes substantially the same as or similar to those illustrated with reference to FIGS. 6 to 24 may be performed.

Referring to FIGS. 37 and 38, processes substantially the same as or similar to those illustrated with reference to FIGS. 25 to 28 may be performed. However, the third mask 340 covering the second contact plug 334 may not be formed, and thus the upper portions of the first and second contact plugs 332 and 334 may be removed to form the fourth and fifth recesses 350 and 355, respectively. By an ion implantation process, the insulation reinforcing layer 305 may be formed on an entire upper surface of the first insulating interlayer 300, and the second and third metal silicide patterns 336 and 338 may be formed on the first and second contact plugs 332 and 334, respectively.

Referring to FIG. 39, processes substantially the same as or similar to those illustrated with reference to FIGS. 29 and 30 may be performed, and thus the first and second insulating spacers 382 and 384 may be formed on sidewalls of the fourth and fifth openings 370 and 375, respectively.

Referring to FIG. 36 again, processes substantially the same as or similar to those illustrated with reference to FIGS. 31 to 34 and FIGS. 1 to 5 may be performed to complete the semiconductor device.

Figure 40:
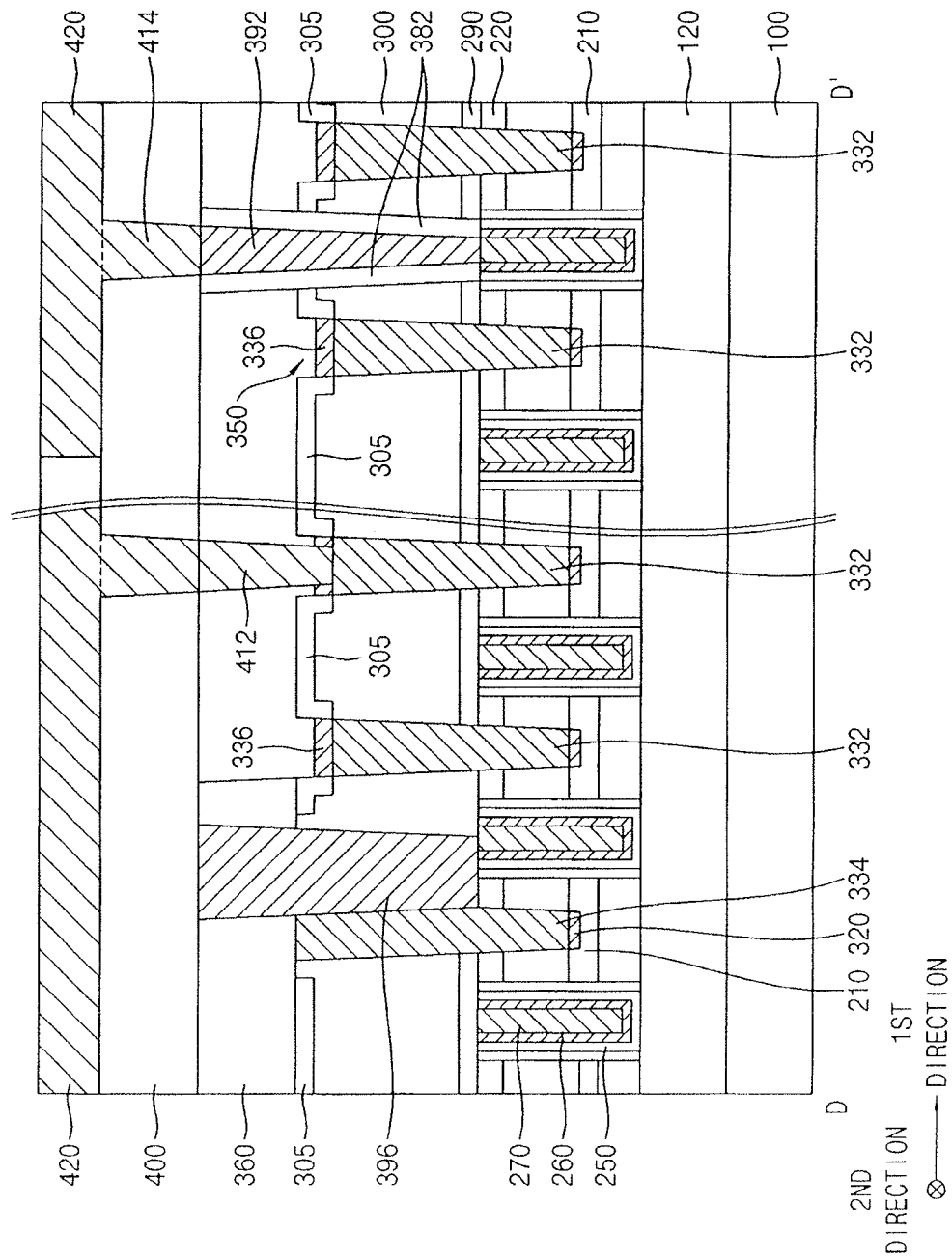
FIGS. 40 and 41 illustrate cross-sectional views of a semiconductor device in accordance with example embodiments.
Figure 41:
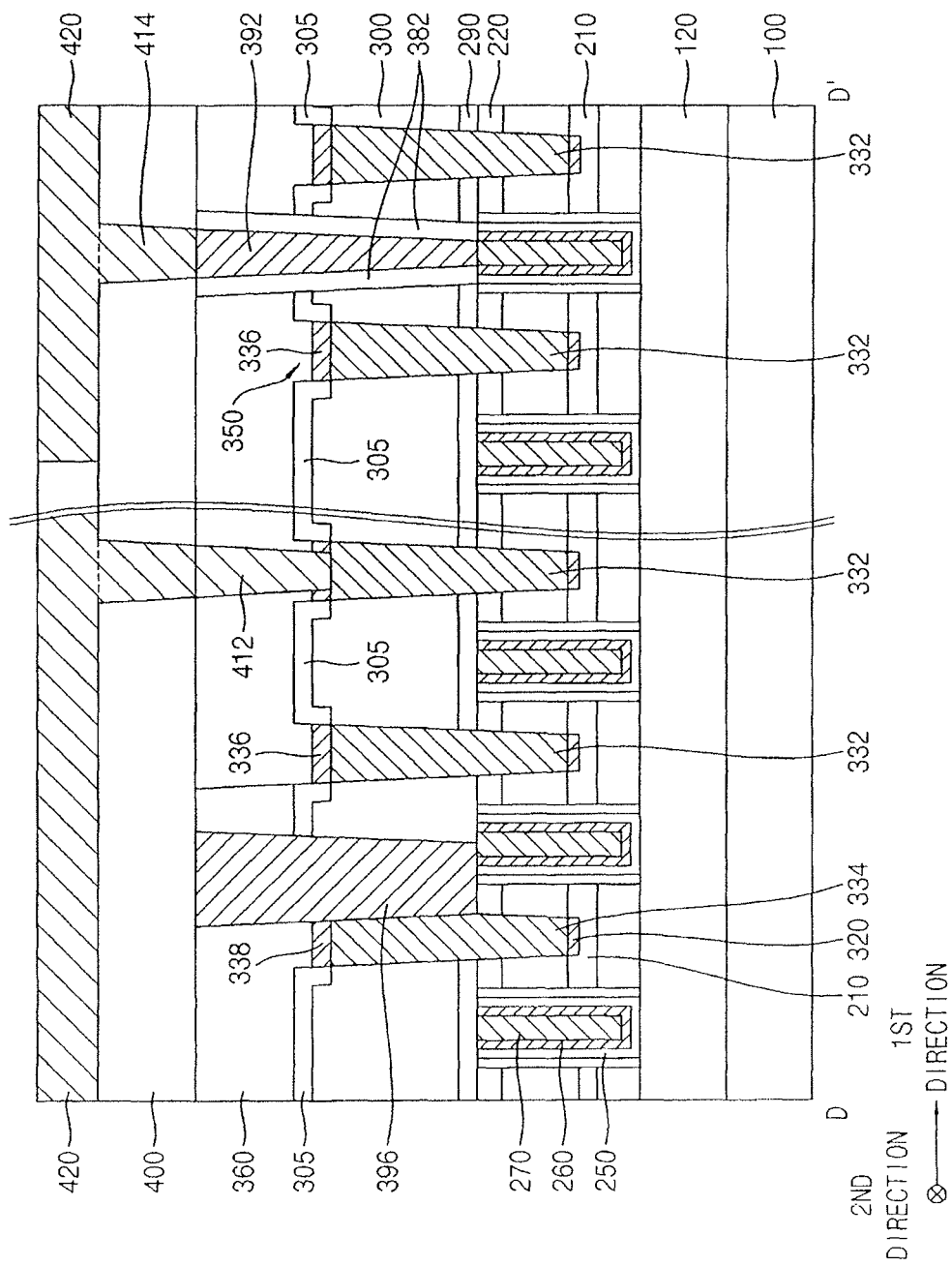

FIGS. 40 and 41 illustrate cross-sectional views of a semiconductor device in accordance with example embodiments. This semiconductor device may be substantially the same as or similar to that of FIGS. 1 to 5, except for the fourth contact plug. Thus, like reference numerals refer to like elements, and detailed descriptions thereon may be omitted below in the interest of brevity.

Referring to FIG. 40, unlike that of FIGS. 1 to 5, the fourth contact plug 394 may commonly contact the upper surface of the gate structure 280 and only one second contact plug 334 adjacent thereto.

Referring to FIG. 41, similarly to that of FIG. 36, not only the fourth recess 350 but also the fifth recess 355 may be formed on the first insulating interlayer 300, and the second contact plug 334 may be formed under the fifth recess 355. Additionally, the third metal silicide pattern 338 may be formed on the second contact plug 334.

The above semiconductor device and the method of manufacturing the semiconductor device may be applied to various types of memory devices including contact plugs.

By way of summation and review, a distance between the first and second contact plugs could be made so great that no electrical short could possibly occur therebetween. However, the first contact plug may be formed not only above the isolation layer but also above the source/drain layer, and thus the distance between the first and second contact plugs may be so short that an electrical short may occur therebetween.

The embodiments may provide a semiconductor device having good characteristics.

In the semiconductor device in accordance with example embodiments, even if cell sizes decrease, the electrical insulation between contact plugs may be enhanced, and the electrical short may be reduced or prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   gate structures on a substrate;
   source/drain layers on portions of the substrate that are adjacent the gate structures, respectively;
   first contact plugs contacting upper surfaces of the source/drain layers, respectively;
   a second contact plug contacting one of the gate structures, a sidewall of the second contact plug being covered by an insulating spacer;
   a third contact plug commonly contacting an upper surface of at least one of the gate structures and at least one of the first contact plugs, at least a portion of a sidewall of the third contact plug not being covered by an insulating spacer; and
   an insulating interlayer covering at least upper sidewalls of the first contact plugs, wherein an upper surface of the insulating interlayer has a varying height.

2. The semiconductor device as claimed in claim 1, wherein:
   the second contact plug is between neighboring ones of the first contact plugs, and
   the second contact plug is electrically insulated from the neighboring ones of the first contact plugs.

3. The semiconductor device as claimed in claim 1, wherein the insulating spacer:
   has a hollow cylindrical shape, and
   includes silicon oxide.

4. The semiconductor device as claimed in claim 1, wherein:
   each of the gate structures extends in a second direction substantially parallel to an upper surface of the substrate,
   each of the source/drain layers is adjacent the gate structures in a first direction substantially parallel to the upper surface of the substrate and crosses the second direction, and
   the second contact plug is adjacent the first contact plugs in the first direction.

5. The semiconductor device as claimed in claim 4, wherein the third contact plug commonly contacts two of the first contact plugs at opposite sides of at least one of the gate structures in the first direction.

6. The semiconductor device as claimed in claim 4, wherein the third contact plug contacts one of the first contact plugs adjacent at least one of the gate structures in the first direction.

7. The semiconductor device as claimed in claim 4, wherein the first and second directions are substantially perpendicular to each other.

8. The semiconductor device as claimed in claim 1, wherein first ones of the first contact plugs contacting the third contact plug have upper surfaces higher than those of second ones of the first contact plugs not contacting the third contact plug.

9. The semiconductor device as claimed in claim 8, wherein:
the first contact plugs include a metal, and
the second ones of the first contact plugs not contacting the third contact plug have a metal silicide at upper portions thereof.

10. The semiconductor device as claimed in claim 1, wherein first ones of the first contact plugs contacting the third contact plug have upper surfaces substantially coplanar with those of second ones of the first contact plugs not contacting the third contact plug.

11. The semiconductor device as claimed in claim 10, wherein the first contact plugs include a metal and have a metal silicide at upper portions thereof.

12. The semiconductor device as claimed in claim 1, wherein:
the insulating interlayer includes silicon oxide, and
at least a portion of an upper portion of the insulating interlayer includes a silicon-rich silicon oxide layer having a silicon content greater than that of a lower portion of the insulating interlayer.

13. The semiconductor device as claimed in claim 12, wherein the silicon-rich silicon oxide layer has a thickness that is substantially constant along the upper surface of the insulating interlayer.

14. The semiconductor device as claimed in claim 1, wherein:
the insulating interlayer has recesses thereon, and
ones of the first contact plugs not contacting the third contact plug are formed under the recesses, respectively.

15. The semiconductor device as claimed in claim 1, wherein:
the insulating interlayer has recesses thereon, and
the first contact plugs are formed under the recesses.

16. The semiconductor device as claimed in claim 1, wherein upper surfaces of the second and third contact plugs are higher than upper surfaces of the first contact plugs.

17. The semiconductor device as claimed in claim 1, further comprising:
a plurality of active fins on the substrate in a second direction substantially parallel to an upper surface of the substrate, each of the plurality of active fins extending in a first direction substantially parallel to the upper surface of the substrate and substantially perpendicular to the second direction; and
an isolation pattern on the substrate, the isolation pattern covering lower sidewalls of the active fins,
wherein:
each of the gate structures extends in the second direction on the active fins and the isolation pattern, and
each of the source/drain layers are adjacent the gate structures in the first direction, and extends in the second direction to a given length.

18. The semiconductor device as claimed in claim 17, further comprising a dummy active fin extending in the first direction between the plurality of active fins, an upper surface of the dummy active fin being lower than those of the plurality of active fins, and the dummy active fin being covered by the isolation pattern, wherein the second contact plug does not vertically overlap the dummy active fin.

19. A semiconductor device, comprising:
gate structures on a substrate;
source/drain layers on portions of the substrate that are adjacent the gate structures, respectively;
first contact plugs contacting upper surfaces of the source/drain layers, respectively;
a second contact plug contacting one of the gate structures, a sidewall of the second contact plug being covered by an insulating spacer; and
a third contact plug commonly contacting an upper surface of at least one of the gate structures and at least one of the first contact plugs, at least a portion of a sidewall of the third contact plug not being covered by an insulating spacer,
wherein first ones of the first contact plugs contacting the third contact plug have upper surfaces higher than those of second ones of the first contact plugs not contacting the third contact plug.

20. A semiconductor device, comprising:
gate structures on a substrate;
source/drain layers on portions of the substrate that are adjacent the gate structures, respectively;
first contact plugs contacting upper surfaces of the source/drain layers, respectively;
a second contact plug contacting one of the gate structures, a sidewall of the second contact plug being covered by an insulating spacer; and
a third contact plug commonly contacting an upper surface of at least one of the gate structures and at least one of the first contact plugs, at least a portion of a sidewall of the third contact plug not being covered by an insulating spacer;
wherein:
each of the gate structures extends in a second direction substantially parallel to an upper surface of the substrate,
each of the source/drain layers is adjacent the gate structures in a first direction substantially parallel to the upper surface of the substrate and crosses the second direction,
the second contact plug is adjacent the first contact plugs in the first direction, and
the third contact plug commonly contacts two of the first contact plugs at opposite sides of at least one of the gate structures in the first direction.

* * * * *